United States Patent
Liu et al.

(10) Patent No.: US 12,155,373 B2
(45) Date of Patent: Nov. 26, 2024

(54) BACKEND AND ACOUSTIC PROCESS INTEGRATION FOR HIGH-Q FILTER

(71) Applicant: QUALCOMM Incorporated, San Diego, CA (US)

(72) Inventors: Kai Liu, Phoenix, AZ (US); Je-Hsiung Lan, San Diego, CA (US); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 697 days.

(21) Appl. No.: 17/450,847

(22) Filed: Oct. 14, 2021

(65) Prior Publication Data

US 2023/0121565 A1   Apr. 20, 2023

(51) Int. Cl.
| | |
|---|---|
| H03H 9/54 | (2006.01) |
| H03H 3/02 | (2006.01) |
| H03H 9/05 | (2006.01) |
| H10N 30/071 | (2023.01) |

(52) U.S. Cl.
CPC .............. *H03H 9/542* (2013.01); *H03H 3/02* (2013.01); *H03H 9/0561* (2013.01); *H10N 30/071* (2023.02)

(58) Field of Classification Search
CPC .... H03H 9/542; H03H 9/0561; H03H 9/0557; H03H 9/0547; H03H 3/02; H03H 3/08; H10N 30/071; H01L 2221/68345; H01L 2221/68359; H01L 21/6835; H01L 23/3114; H01L 24/19; H01L 2224/04105; H01L 2224/12105; H01L 2224/214; H01L 2224/32225; H01L 2224/92244; H01L 2924/18162
See application file for complete search history.

(56) References Cited

U.S. PATENT DOCUMENTS

| | | | | |
|---|---|---|---|---|
| 9,159,777 | B2 * | 10/2015 | Meyer-Berg | H01L 23/5227 |
| 10,840,884 | B2 * | 11/2020 | Song | H03H 9/02015 |
| 11,316,497 | B2 * | 4/2022 | Dogiamis | H03H 9/54 |
| 11,431,321 | B2 * | 8/2022 | Schiek | H03H 9/0547 |
| 2020/0035654 | A1 | 1/2020 | Chen et al. | |
| 2021/0035929 | A1 | 2/2021 | Park et al. | |
| 2022/0406288 | A1 * | 12/2022 | Liu | H03H 3/007 |

OTHER PUBLICATIONS

Ho S.W., et al., "Through Mold Interconnects For Fan-Out Wafer Level Package", IEEE Electronics Packaging Technology Conference, Nov. 2016, pp. 51-56, XP033067507, Abstract, Figures 1, 2.
International Search Report and Written Opinion—PCT/US2022/076503—ISA/EPO—Jan. 9, 2023.

(Continued)

*Primary Examiner* — Emily P Pham
(74) *Attorney, Agent, or Firm* — Muncy, Geissler, Olds & Lowe, P.C.

(57) ABSTRACT

Disclosed is a radio frequency (RF) filter that vertically integrates an acoustic die with inductors formed in one or more layers above the acoustic die. The acoustic die may be over-molded so that the acoustic dome, important for maintaining acoustic integrity, may be protected.

30 Claims, 17 Drawing Sheets

(56) References Cited

OTHER PUBLICATIONS

Tang T.C., et al., "High Q-factor 3D Solenoid Inductor on InFO Package for RF System Integration", 2019 Electrical Design of Advanced Packaging and Systems (EDAPS), IEEE, Dec. 16, 2019, pp. 1-3, XP033727766, DOI:10.1109/EDAPS47854.2019.9011648, [retrieved on Feb. 24, 2020], Abstract, Figure 3, Table I,Section II.
Yoon Y.K., et al., "Embedded Conductor Technology for Micromachined RF Elements", Journal of Micromechanics and Microengineering, vol. 15, No. 6, Jun. 2005, pp. 1317-1326, XP020091597, Abstract, Figures 1-7, Sections 1-4.

* cited by examiner

BACKEND AND ACOUSTIC PROCESS INTEGRATION FOR HIGH-Q FILTER

FIELD OF DISCLOSURE

This disclosure relates generally to radio frequency (RF) filters, and more specifically, but not exclusively, to a high-Q RF filters and fabrication techniques thereof.

BACKGROUND

Integrated circuit technology has achieved great strides in advancing computing power through miniaturization of active and passive components. The package devices can be found in many electronic devices, including processors, servers, radio frequency (RF) integrated circuits, etc. Packaging technology becomes cost-effective in high pin count devices and/or high production volume components.

Surface mounted device (SMD) inductors can be utilized in RF filters. However, this is not the most ideal due to their physical dimensions. Also, SMD inductors can be costly.

Accordingly, there is a need for systems, apparatus, and methods that overcome the deficiencies of conventional RF filters including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary radio frequency (RF) filter is disclosed. The RF filter may comprise an acoustic die. The RF filter may also comprise a lower mold formed on sides and upper surface of the acoustic die. The lower mold may cover an acoustic dome of the acoustic die. The lower mold may have one or more lower mold via holes that expose one or more bond pads of the acoustic die. The RF filter may further comprise one or more lower conductors formed on the lower mold and in the one or more lower mold via holes to electrically couple with the one or more bond pads. The RF filter may yet comprise one or more inductors formed in one or more layers above the lower mold. The one or more inductors may be electrically coupled to the acoustic die through the one or more lower conductors and the one or more bond pads such that an electrical signal is filtered through the acoustic die and the one or more inductors.

A method of fabricating an RF filter is disclosed. The method may comprise forming a lower mold on sides and upper surface of an acoustic die. The lower mold may cover an acoustic dome of the acoustic die. The lower mold may have one or more lower mold via holes that expose one or more bond pads of the acoustic die. The method may also comprise forming one or more lower conductors on the lower mold and in the one or more lower mold via holes to electrically couple with the one or more bond pads. The method may further comprise forming one or more inductors in one or more layers above the lower mold. The one or more inductors may be electrically coupled to the acoustic die through the one or more lower conductors and the one or more bond pads such that an electrical signal is filtered through the acoustic die and the one or more inductors.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
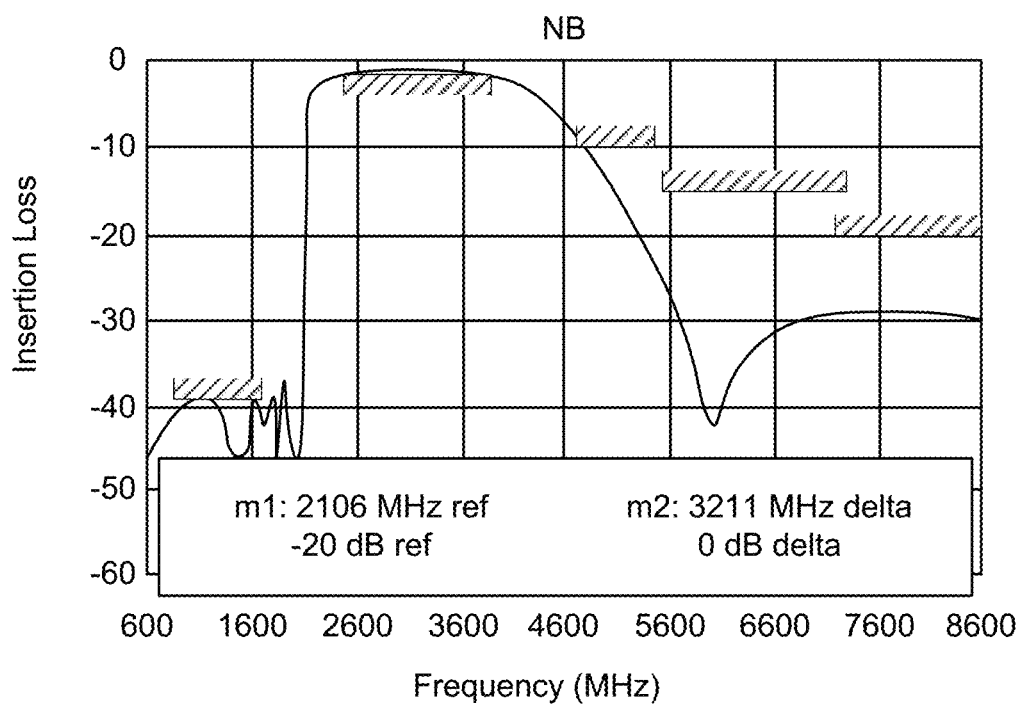
FIG. 1 is a graph of an example frequency response of a radio frequency filter in accordance with one or more aspects of the disclosure.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1 illustrates an example of a desired response of a RF filter, e.g., for 5G New Radio (5G NR) applications. The bandpass frequency may range between 2.1 GHz and 3.2 GHz. Typically, an acoustic wave die (e.g., surface acoustic wave (SAW) die, bulk acoustic wave (BAW) die, etc.) typically has sharper roll-off response and better band selection (with narrow band) compared to the LC-type filters (e.g., LTCC, POG, etc.). If acoustic wave filters can be combined with other filters, then it can be possible to arrive at an RF filter with good performance in both near-in-band and harmonics in terms of filter rejection, sensitivity, etc. Attempts to combine have been made by adding external filters (e.g., low pass filter (LPF), band pass filter (BPF), etc.) through laminate or discrete surface mount device (SMD).

Unfortunately, such attempts to combine come with their own issues. For example, adding external filters through laminate or SMD consumes considerable space and hence increases module size, and can also lead to performance degradation. SMDs are subject to manufacturing and/or assembly variations. This can lead to coupling issues which can degrade RF performance. SMD inductors can also be expensive. Since SMD inductors are separate devices, keep-out zones may be necessary to provide sufficient component-to-chip separation.

Figure 2A:
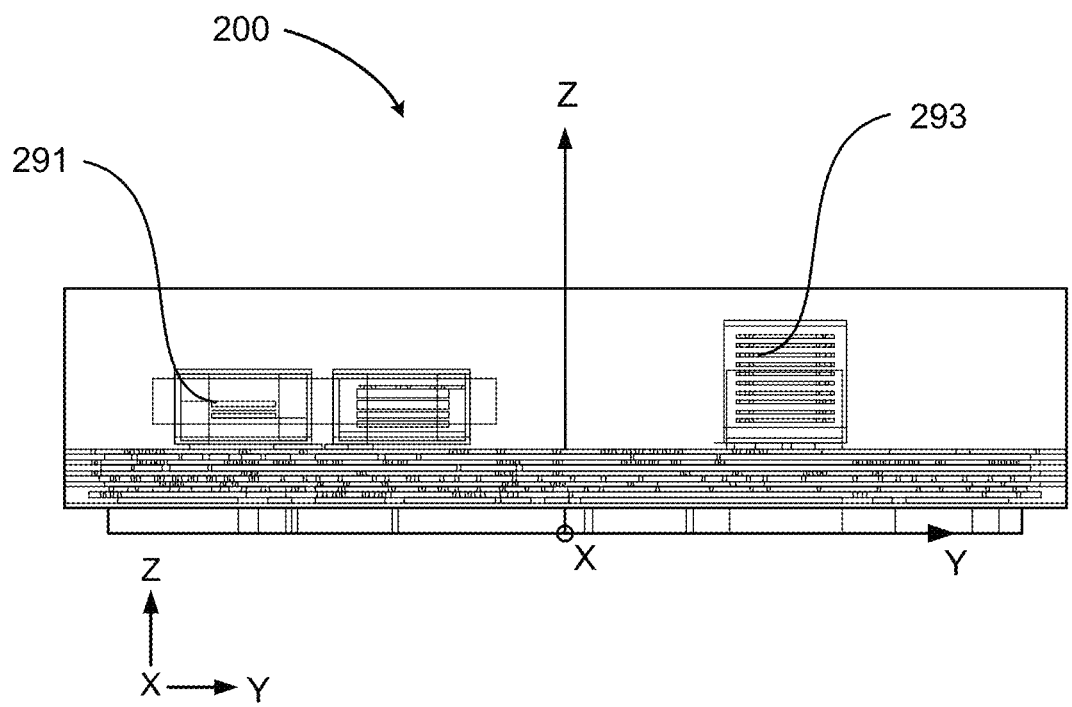
FIGS. 2A and 2B illustrate cross-sectional and top views of a conventional radio frequency filter that includes surface mounted device inductors.
Figure 2B:
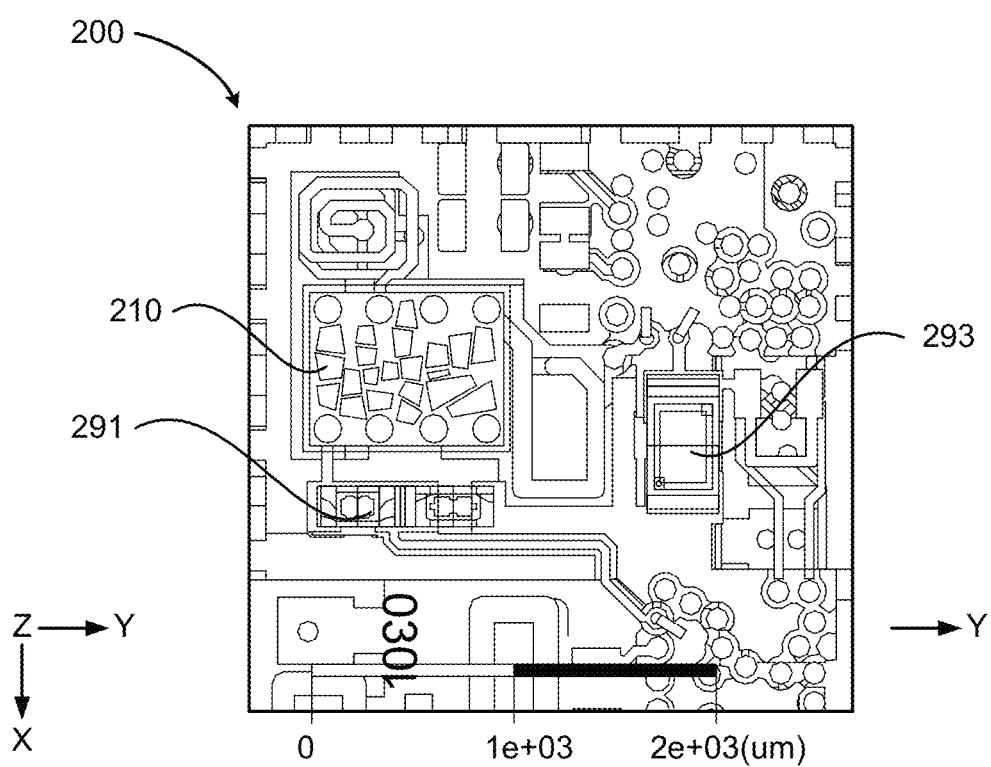

Another issue is that SMD inductors are typically the tallest device on the RF filter module. This is illustrated in FIGS. 2A and 2B which show cross-sectional and top views of a conventional RF filter 200. As seen, the conventional RF filter 200 includes a BAW die 210 along with other circuitry. The RF filter 200 also includes a first SMD inductor 291 and a second SMD inductor 293. As seen, the SMD inductors 291, 293 are quite tall relative to rest of the components of the RF filter 200. This means that there can be height restrictions on the rest of the modules and devices of the RF filter 200 due to the tall SMD inductors 291, 293.

Figure 3:
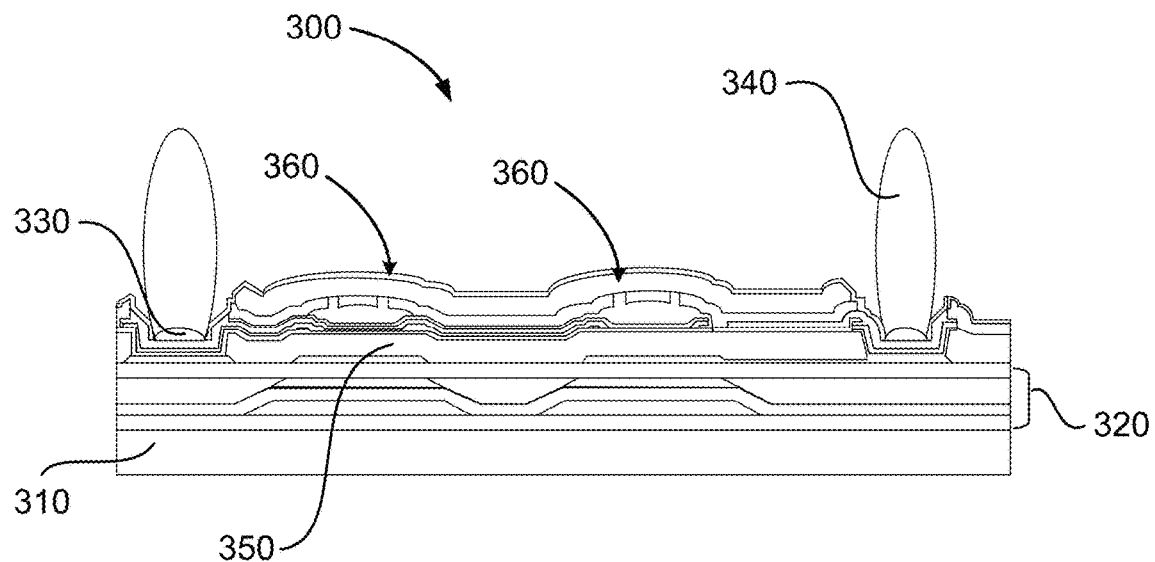
FIG. 3 illustrate a cross-sectional view of an example of a bulk acoustic wave die in accordance with one or more aspects of the disclosure.

FIG. 3 illustrates a cross-sectional view of a BAW die (e.g., BAW die 210). The BAW die 300 may include a wafer 310 (e.g., Si wafer), a layer group 320 comprising layers mirrors and base, a piezo-electric layer 350, bond pads 330, and bumps 340 on the bond pads 330. To allow for proper acoustic behaviors, the BAW die 300 also includes one or more acoustic dome structures 360—or simply acoustic domes 360. The acoustic domes 360 are above the piezo-electric layer 350 and in between the bond pads 330.

Figure 4:
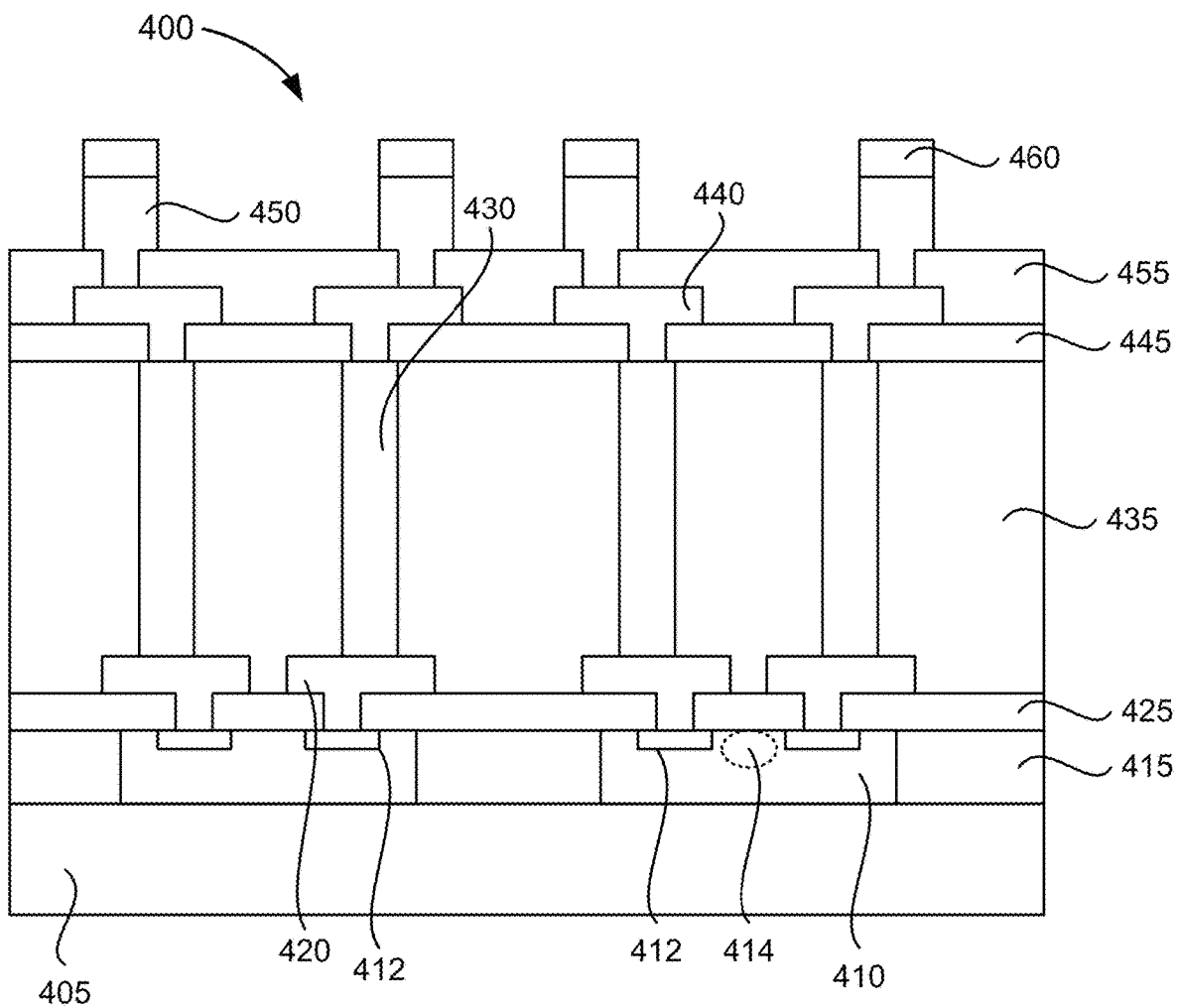
FIG. 4 illustrates a cross-sectional view of incorporating 3D solenoid inductor in radio frequency filters with bulk acoustic wave dies using a conventional fabrication technique.

One way to address the issues raised above may to incorporate 3D solenoid inductors in the RF filter device instead of relying upon SMD inductors. An example is illustrated in FIG. 4 in which 3D solenoid inductors are incorporated in RF filters using a conventional fabrication technique. In FIG. 4, an acoustic wafer structure 400 comprising a plurality of RF filters 400 may be placed on a reconstitution wafer 405.

As seen, a plurality of BAW dies 410 may be placed on the reconstitution wafer 405. In this instance, two BAW dies 410 are shown. Each BAW die 410 may be the BAW die 300 illustrated in FIG. 3. The BAW die 410 may include the bond pads 412 (corresponding to bond pad 330). For simplicity, other components—wafer, layer group, bump, etc. are not shown. The dashed oval indicates the location of the acoustic dome of the BAW die 410. As seen, the acoustic dome 414 may be located in between the bond pads 412.

A lower mold 415 may be formed on the reconstitution wafer 405 and on the BAW dies 410, and backgrinded to expose the bond pads 412. A lower polyimide layer 425 may be formed on the lower mold 415 and on the BAW dies 410 and patterned to form via holes—lower polyimide via holes—in locations corresponding to the bond pads 412. That is, the bond pads 412 may be exposed through the lower polyimide via holes. Then copper (Cu) may be plated on the lower polyimide layer 425 and in the lower polyimide via holes to form lower conductors 420 connected to the bond pads 412. The lower conductor 420 may form a lower redistribution layer (RDL).

Cu pillars 430 may be formed on the lower conductors 420. Then an upper mold 435 may be deposited and backgrinded to expose the upper surfaces of the Cu pillars 430. A first upper polyimide layer 445 may be formed on the upper mold 435 and patterned to form first upper polyimide via holes in locations corresponding to the Cu pillars 430 to expose the upper surfaces of the Cu pillars 430. Then Cu may be plated on the first upper polyimide layer 445 and in the first upper polyimide via holes to form upper conductors 440 connected to the Cu pillars 430. The upper conductors 440 may form an upper RDL.

Thereafter, a second upper polyimide layer 455 may be formed on the first upper polyimide layer 445 and processed to form second upper polyimide via holes in locations to expose the upper surfaces of the upper conductors 440. Then Cu may be plated on the second upper polyimide layer 455 and in the second upper polyimide via holes to form external contacts 450 connected to the upper conductors 440. Then solders 460 may be formed on the external contacts 450. In this way, at least one solder 460 may be electrically coupled to at least one BAW die 410 through the external contact 450, an upper conductor 440, a CU pillar 430, a lower conductor 420, and a bond pad 412.

Unfortunately, the RF filter device illustrated in FIG. 4 can be problematic. Recall that after the BAW die 410 is placed on the reconstitution wafer 405, the lower mold 415 may be deposited on the reconstitution wafer 405 and on the BAW die 410 to cover the upper portions of the BAW die 410. Then the lower mold 415 can be backgrinded to expose the bond pads 412. However, as seen in FIG. 3, the acoustic dome 360, which is provided for proper acoustic behavior, is above the bond pads 330. This means that when the lower mold 415 is backgrinded to expose the bond pads 412, the acoustic dome 360 of the BAW die 410 can get damaged.

Figure 5A:
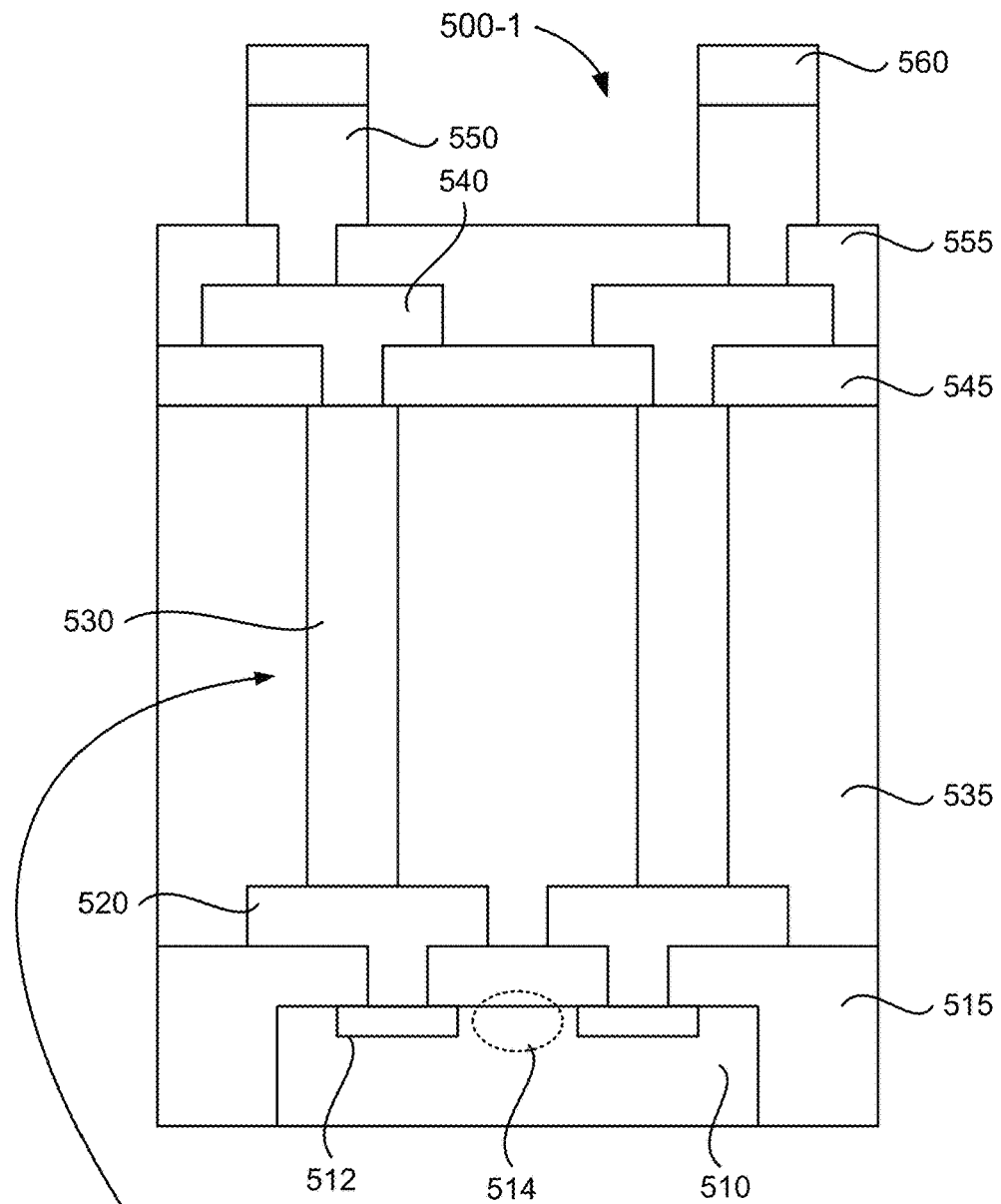
FIGS. 5A-5D illustrate examples of a radio frequency filter in accordance with one or more aspects of the disclosure.

One or more techniques to address such issues are proposed. That is, it is proposed to provide RF filters through techniques that incorporate 3D (or solenoid) inductors without damaging the acoustic domes of the acoustic dies (e.g., BAW dies). FIG. 5A illustrates an example of an RF filter 500-1, which may comprise an acoustic die 510. In an aspect, the acoustic die 510 may be a BAW die such as the BAW die 300. For description purposes, it will be assumed that the acoustic die 510 is a BAW die, while recognizing that other types of acoustic dies may be used in place.

A lower mold 515, which may be insulative, may be formed on sides and on upper surface of the BAW die 510. That is, the BAW die 510 may be over-molded with the lower mold 515. The lower mold 515 may be patterned with one or more lower mold via holes in locations such that at least portions of the upper surfaces of the bond pads 512 are exposed through the one or more lower mold via holes. Dashed oval 514 may indicate the acoustic dome of the BAW die 510.

Due to the over-molding, the lower mold 515 may be formed over the BAW die 510 such that lower mold 515 covers the acoustic dome 514 of the BAW die. Note that the upper surface of the lower mold 515 is well above the acoustic dome 514 of the BAW die 510. It may be said that the lower mold 515 encapsulates the acoustic dome 514. As a result, the acoustic dome 514 may be protected, which in turn may maintain the acoustic integrity of the BAW die 510, and the performance of the RF filter 500-1 as a whole may be enhanced.

Conductive materials (e.g., Cu, Al, etc.) may be deposited and patterned on the lower mold 515 and in the lower mold vias to form one or more lower conductors 520. The lower conductors 520 may electrically couple with the bond pads 512. For example, the portion of the lower conductor 520 formed within the lower mold vias may be in physical or ohmic contact with the bond pads 512. The lower conductors 520 may form a lower redistribution layer (RDL) of the RF filter 510-1.

Conductive materials (e.g., Cu) may then be deposited and patterned to form one or more conductive pillars 530 on the lower conductors 520 and on the lower mold 515. In an aspect, heights of the conductive pillars 530 may range between 150-200 microns. The dimensions (height, thickness) of the conductive pillars 530 may be determined based on desired characteristics (e.g., desired induction values). The conductive pillars 530 may be electrically coupled with the lower conductors 520. For example, the conductive pillars 530 may be in physical or ohmic contact with the lower conductor 520. Then it may be said that the conductive pillars 530 may be electrically coupled with the lower RDL.

An upper mold 535, which may be insulative, may be deposited and patterned to encapsulate the sides of the conductive pillars 530 while upper surfaces of the conductive pillars 530 are exposed.

A first passivation layer 545 may be deposited and patterned on the upper mold 535 to form one or more first upper passivation vias to expose at least portions of the one or more conductive pillars 530. The first passivation layer 545 may be a first polyimide layer.

Conductive materials (e.g., Cu) may be deposited and patterned on the first passivation layer 545 and in the first upper passivation vias to form upper conductors 540. The upper conductors 540 may electrically couple with the conductive pillars 530. For example, the portion of the upper conductor 540 formed within the first upper passivation vias may be in physical or ohmic contact with the conductive pillars 530. The upper conductors 540 may form an upper RDL of the RF filter 510-1. Then it may be said that the conductive pillars 530 may also be electrically coupled with the upper RDL.

A second passivation layer 555 may be deposited and patterned on the on the first passivation layer 545 to form one or more second upper passivation vias to expose at least portions of the one or more upper conductors 540. The second passivation layer 555 may be a second polyimide layer.

Conductive materials (e.g., Cu) may be deposited and patterned on the second passivation layer 555 and in the second upper passivation vias to form one or more external contacts 550. The external contacts 550 may electrically couple with the upper conductors 540. For example, the portion of the external contacts 550 formed within the second upper passivation vias may be in physical or ohmic contact with the upper conductor 540. The external contacts 550 may allow the RF filter 500-1 to be connected with devices external to the RF filter 500-1. Also note that the external contacts 550 need not line up vertically with the bond pads 512 due to the lower and/or upper RDL. More specifically, the centers of the external contacts 550 need not line with centers of the bond pads 512. This implies that there can be significant flexibility in routing signals.

Interconnects 560 may be formed on the external contacts 550. In an aspect, solders may be used to form the interconnects 560. As a result, at least one interconnect 560 may be electrically coupled to a BAW die 510 through at least one external contact 550, at least one upper conductor 540, at least one conductive pillar 530, at least one lower conductor 520, and at least one bond pad 512. It may also be said that at least one interconnect 560 is electrically coupled to a BAW die 510 through at least one external contact 550, the upper RDL, at least one conductive pillar 530, the lower RDL, and at least one bond pad 512.

Figure 5B:
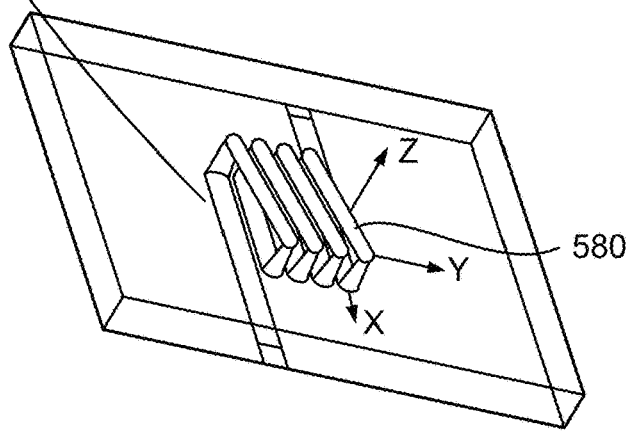

FIG. 5B illustrates an example of a 3D inductor 580 (or solenoid inductor 580) that may be formed in the RF filter 500-1. In an aspect, the 3D inductor 580 may be formed through a combination of one or more conductive pillars 530, one or more lower conductors 520, and one or more upper conductors 540. In particular, one or more loops of the 3D inductor 580 may comprise one or more conductive pillars 530, one or more lower conductors 520, and one or more upper conductors 540. That is, the loops of the 3D inductor 580 may be formed through the lower RDL (i.e., the lower conductors 520), the upper RDL (i.e., the upper conductors 540), and the conductive pillars 530. While not shown, there can be any number of 3D inductors 580 formed by the conductive pillars 530, the lower conductors 520, and the upper conductors 540.

Note that at least one 3D inductor 580 may be electrically coupled to the BAW die 510. As a result, an electrical signal may be filtered through both the BAW die 510 and the at least one 3D inductor 580. Also, at least one external contact 550 may be electrically coupled to the acoustic die through the one or more inductors such as the at least one 3D inductor 580.

Figure 5C:
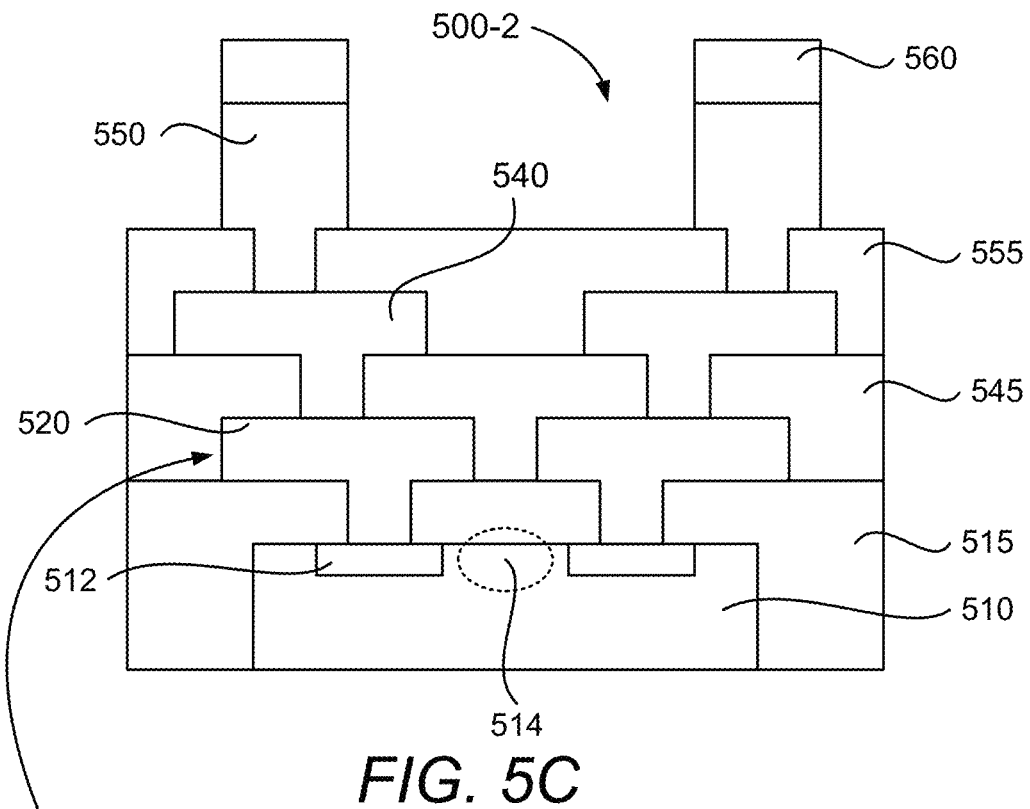

There may be occasions in which very high-Q filters are not necessary. In these instances, 2D inductors (or laminate inductors) may be sufficient. FIG. 5C illustrates an example of an RF filter 500-2, which may also comprise an acoustic die 510 (e.g., BAW die). The RF filter 500-2 of FIG. 5C may be similar to the RF filter 500-1 (of FIG. 5A), except that 2D inductors may be formed instead of the 3D inductors.

The RF filter 500-2 may comprise a BAW die molded with a lower mold 515. Similar to FIG. 5A, the BAW die 510 may be over-molded. As a result, the acoustic dome 514 of the BAW die 510 may be protected by the lower mold 515. The lower mold 515 may be patterned with one or more lower mold via holes in locations such that at least portions of the upper surfaces of the bond pads 512 are exposed through the one or more lower mold via holes.

Conductive materials (e.g., Cu, Al, etc.) may be deposited and patterned on the lower mold 515 and in the lower mold vias to form lower conductors 520. The lower conductors 520 may electrically couple with the bond pads 512 (e.g., portions of the lower conductor 520 may be in physical or ohmic contact with the bond pads 512). The lower conductors 520 may form a lower RDL of the RF filter 510-2.

Note that there are no conductive pillars 530 and no upper mold 535. Instead, a first passivation layer 545 may be deposited and patterned on the lower mold 515 to form one or more first upper passivation vias to expose at least portions of the one or more lower conductors 520. The first passivation layer 545 may be a first polyimide layer.

Conductive materials (e.g., Cu) may be deposited and patterned on the first passivation layer 545 and in the first upper passivation vias to form upper conductors 540. The upper conductors 540 may electrically couple with the lower conductors 520 (e.g., portions of the upper conductors 540 may be in physical or ohmic contact with the lower conductors 520). The upper conductors 540 may form an upper RDL of the RF filter 510-2. Then it may be said that the upper and lower RDLs may be electrically coupled.

A second passivation layer 555 may be deposited and patterned on the on the first passivation layer 545 to form one or more second upper passivation vias to expose at least portions of the one or more upper conductors 540. The second passivation layer 555 may be a second polyimide layer.

Conductive materials (e.g., Cu) may be deposited and patterned on the second passivation layer 555 and in the second upper passivation vias to form one or more external contacts 550. The external contacts 550 may electrically couple with the upper conductors 540 (e.g., portions of the external contacts 550 may be in physical or ohmic contact with the upper conductor 540).

Interconnects 560 (e.g., solders) may be formed on the external contacts 550. As a result, at least one interconnect 560 may be electrically coupled to the BAW die 510 through at least one external contact 550, at least one upper conductor 540, at least one lower conductor 520, and at least one bond pad 512.

Figure 5D:
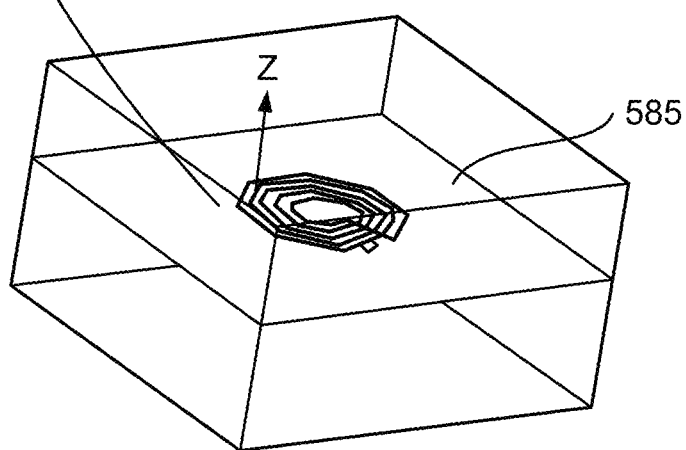

FIG. 5D illustrates an example of a 2D inductor 585 (or laminate inductor 585) that may be formed in the RF filter 500-2. In an aspect, the 2D inductor 585 may be formed through one or more lower conductors 520. That is, the loops of the 2D inductor may be formed by the one or more lower conductors 520, i.e., by the lower RDL. Alternatively or in addition thereto, the 2D inductor 585 may be formed through one or more upper conductors 540. That is, the loops of the 2D inductor may be formed by the one or more upper conductors 540, i.e., the upper RDL. While not shown, there can be any number of 3D inductors 580 formed by the lower conductors 520 and/or the upper conductors 540. When there are multiple 2D inductors, some may be formed through the lower conductors 520 while others may be formed through the upper conductors 540.

Note that at least one 2D inductor 585 may be electrically coupled to the BAW die 510. As a result, an electrical signal may be filtered through both the BAW die 510 and the at least one 2D inductor 585. Also, at least one external contact 550 may be electrically coupled to the acoustic die through the one or more inductors such as the at least one 2D inductor 585.

Note that in FIGS. 5A and 5C, the RF filters 500-1, 500-2 (collectively RF filters 500) are example of vertical integration. That is the acoustic die 510 and passive filters may be integrated vertically. This can help to save space.

FIGS. 6A-6G illustrate examples of stages of fabricating an RF filter, such as the RF filter 500-1 (of FIGS. 5A and 5B) in accordance with one or more aspects of the disclosure. Broadly, acoustic dies may first be fabricated. Then, an integrated passive device (IPD) formation process may be performed to integrate one or more passive devices (e.g., inductors) with the acoustic die. Again, for description purposes, a BAW die will be used as an example of the acoustic die.

Figure 6A:
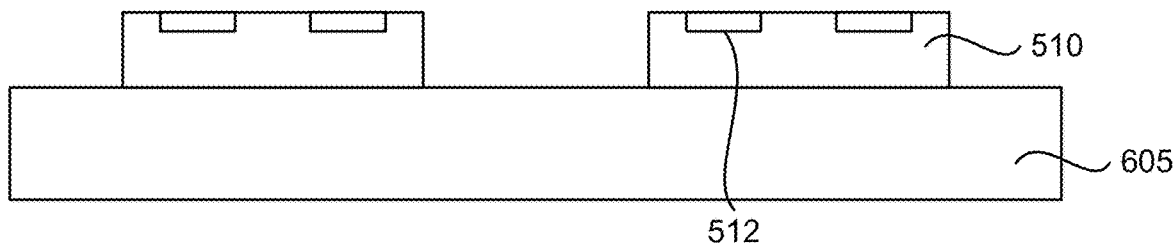
FIGS. 6A-6G illustrate examples of stages of fabricating a radio frequency filter in accordance with one or more aspects of the disclosure.

FIG. 6A illustrates a stage in which one or more BAW dies 510 may be placed on a reconstitution wafer 605. The reconstitution wafer 605 may also be referred to as bonding/debonding wafer 605.

Figure 6B:
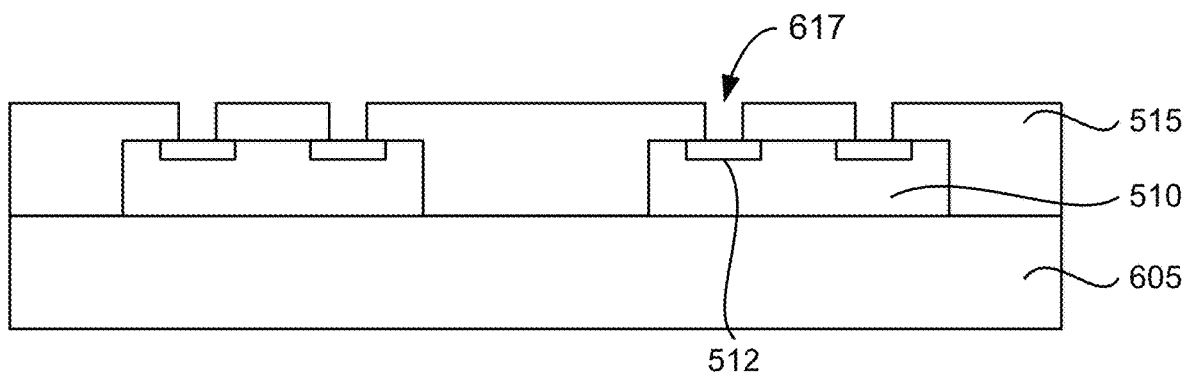

FIG. 6B illustrates a stage in which the lower mold 515 may be deposited on the reconstitution wafer 605 and on the BAW dies 510 to cover the BAW dies 510. The lower mold 515 may be patterned to form lower mold via holes 617 in locations corresponding to the bond pads 512 of the BAW dies 510. The bond pads 512 may be exposed by the lower mold via holes 617.

In one aspect, the lower mold via holes 617 may be formed by laser drilling the lower mold 515. For example, the BAW dies 510 may be over-molded such that upper surfaces of the BAW dies 510. In particular, the upper portion of the BAW dies 510 in between the bond pads 512—i.e., the portion corresponding to the acoustic domes 514—covered with the lower mold 515. Then portions of the lower mold 515 corresponding to the bond pads 512 may be laser drilled to form the lower mold via holes 617.

Note that after over-molding the BAW dies 510, the lower mold 515 can be planarized prior to the laser drilling. However, the planarization is NOT used to expose the bond pads 512. Rather, the lower mold via holes 617 are formed to expose the bond pads 512. In this way, the acoustic domes 514 remain protected by the lower mold 515.

Figure 6C:
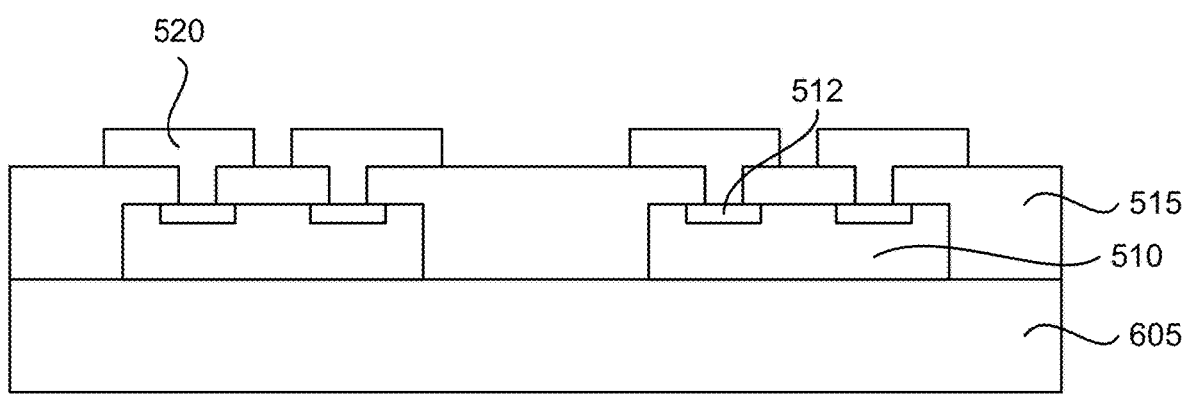

FIG. 6C illustrates a stage in which one or more conductive materials (e.g., metals such as Cu, Al, etc.) may be deposited on the lower mold 515 and in the lower mold via holes 617 to form one or more lower conductors 520. A lower RDL may comprise the one or more lower conductors 520.

Figure 6D:
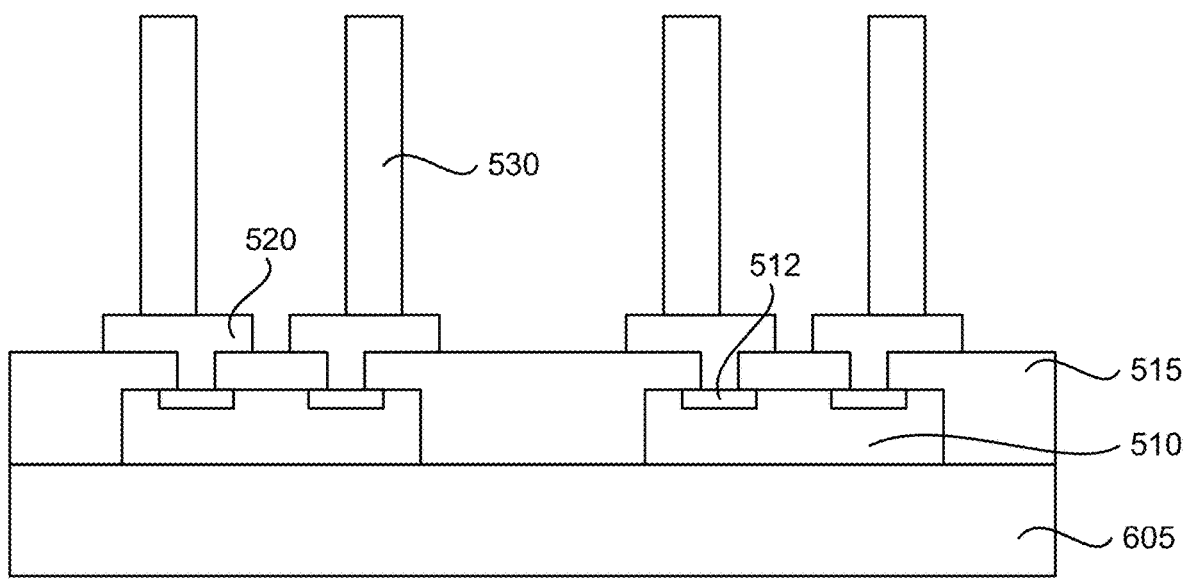

FIG. 6D illustrates a stage in which one or more conductive materials (e.g., Cu, Al, etc.) may be deposited and patterned on the lower conductors 520 to form one or more conductive pillars 530.

Figure 6E:
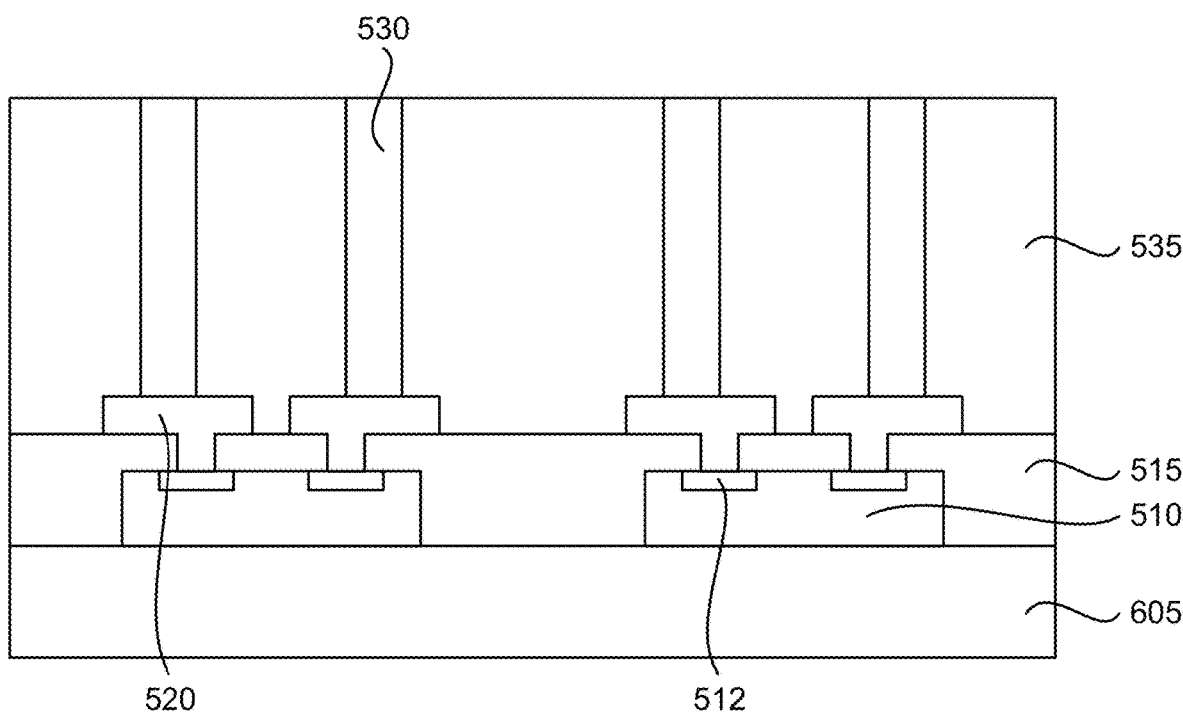

FIG. 6E illustrates a stage in which an upper mold 535 may be deposited and patterned on the lower mold 515 and on the lower RDL (e.g., the lower conductors 520). The upper mold 535 may be formed on the sides of the conductive pillars 530 and patterned to expose the upper surfaces of the conductive pillars 530. For example, the upper mold 535 may be deposited to encapsulate the conductive pillars 530 including the upper surfaces thereof. Then the upper mold 535 may be planarized (e.g., backgrinded) to expose the conductive pillars 530.

Figure 6F:
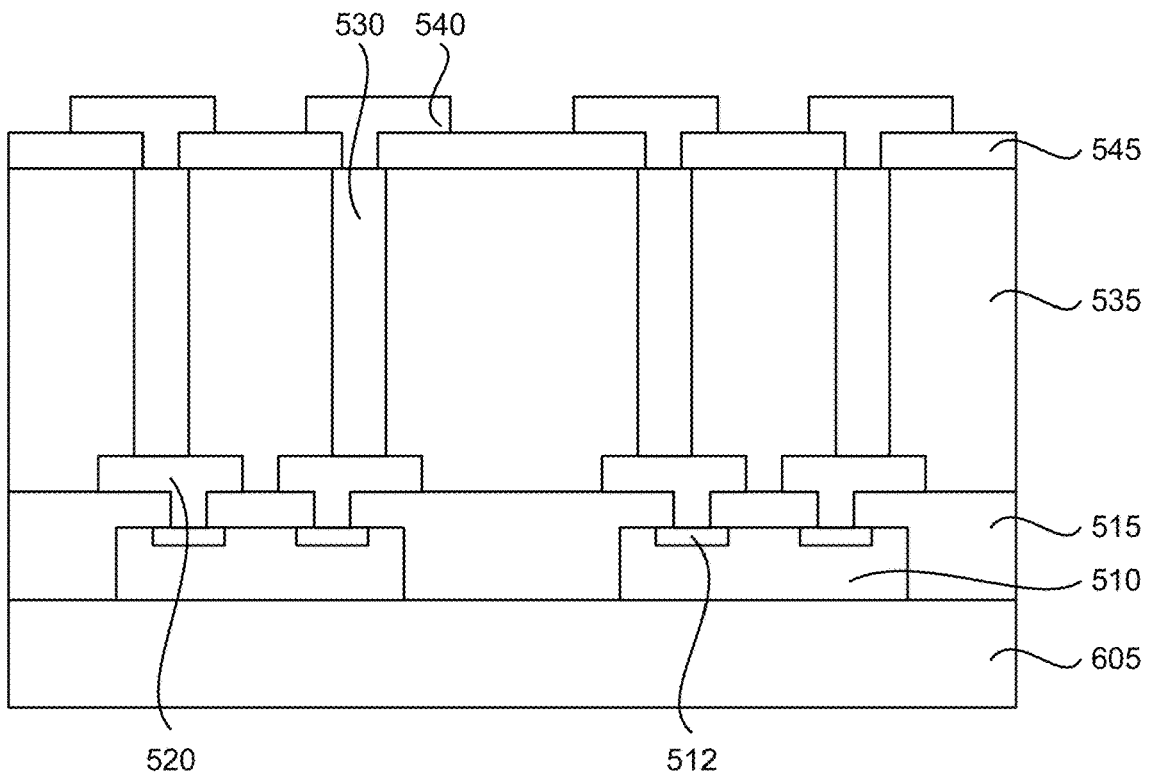

FIG. 6F illustrates a stage in which a first passivation layer 545 may be deposited on the upper mold 535 and on the conductive pillars 530. The first passivation layer 545 may be patterned to form first upper passivation via holes to expose at least portions of the one or more conductive pillars 530. Then one or more conductive materials (e.g., Cu, Al, etc.) may be deposited and patterned on the first passivation layer 545 and in the first upper passivation via holes to form one or more upper conductors 540. An upper RDL may comprise the one or more upper conductors 540.

As indicated above with respect to FIG. 5B, one or more 3D inductors 580 may be formed in stages illustrated in FIGS. 6C-6F.

Figure 6G:
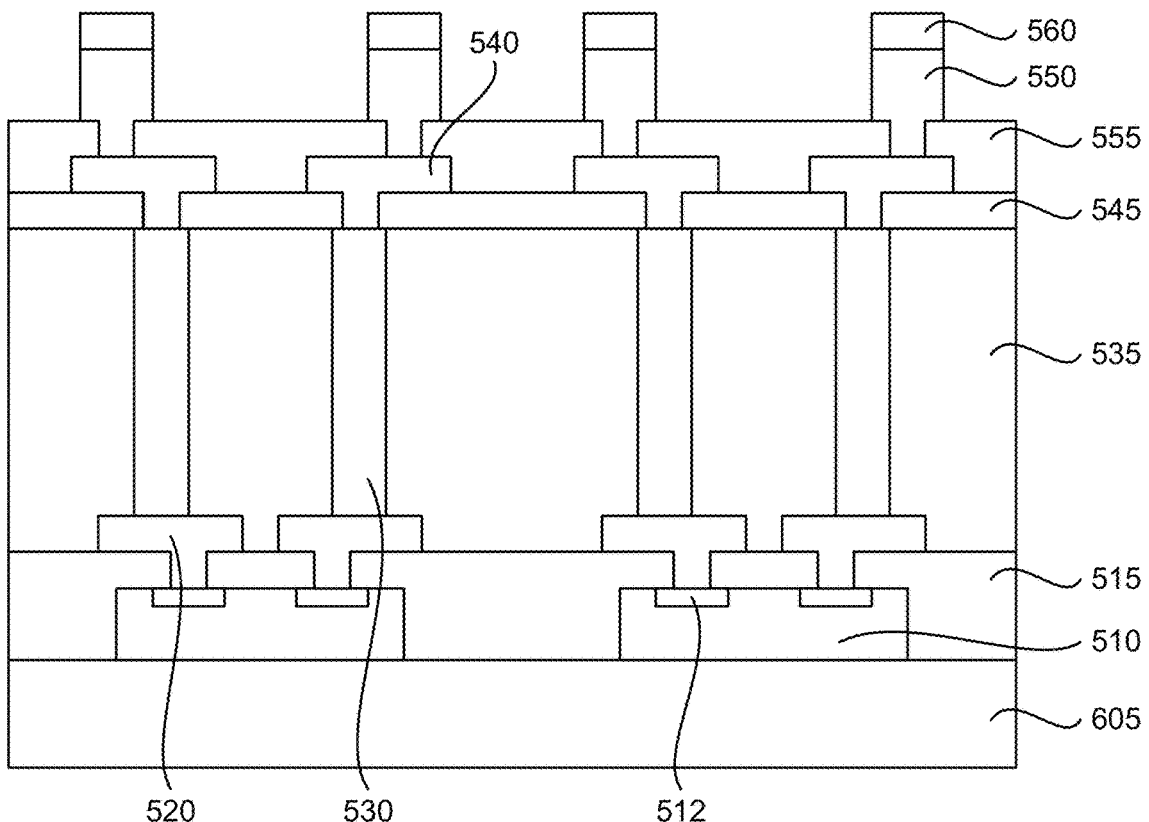

FIG. 6G illustrates a stage in which one or more conductive materials (e.g., Cu, Al, etc.) may be deposited and patterned on the upper RDL (e.g., on the upper conductors 540) to form one or more external contacts 550. Also, one or more interconnects (e.g., solder) 560 may be formed on the external contacts 550. While not shown, individual RF filters 500-1 may be sliced from other RF filters 500-1, after the reconstitution wafer 605 may be debonded.

With respect to FIGS. 6B and 6C, it is indicated that the lower mold via holes 617 may be laser-drilled, and the lower conductors 520 may be formed to fill the lower mold via holes 617. There are other ways to form the lower conductors 520.

Figure 7A:
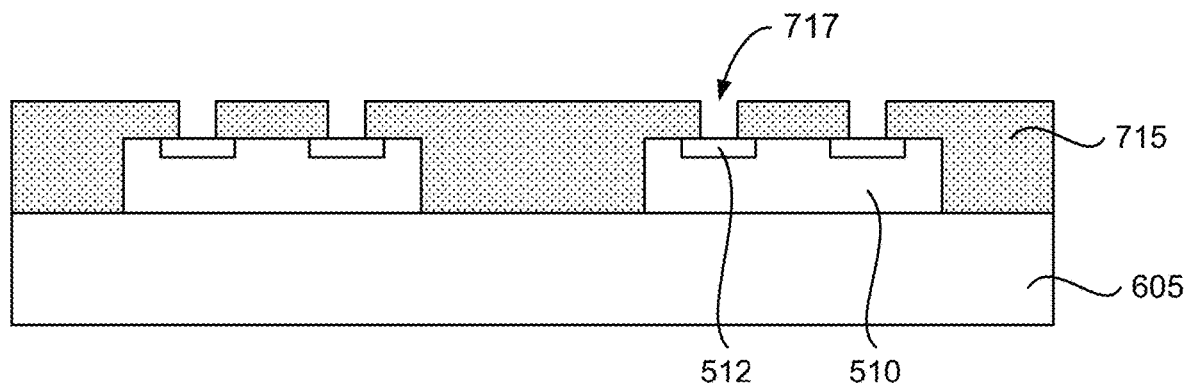
FIGS. 7A-7E illustrate examples of alternative stages of fabricating a radio frequency filter in accordance with one or more aspects of the disclosure.

FIGS. 7A-7E shows example stages of one such alternate technique. From FIG. 6A, the fabrication process may proceed to FIG. 7A illustrating a stage in which a photoresist 715 may be deposited on the reconstitution wafer 605 and on the BAW dies 510 to cover the BAW dies 510. The photo resist may be patterned (e.g., through masking and exposure) to form photoresist via holes 717 in locations corresponding to the bond pads 512 so that the bond pads 512 are exposed.

Figure 7B:
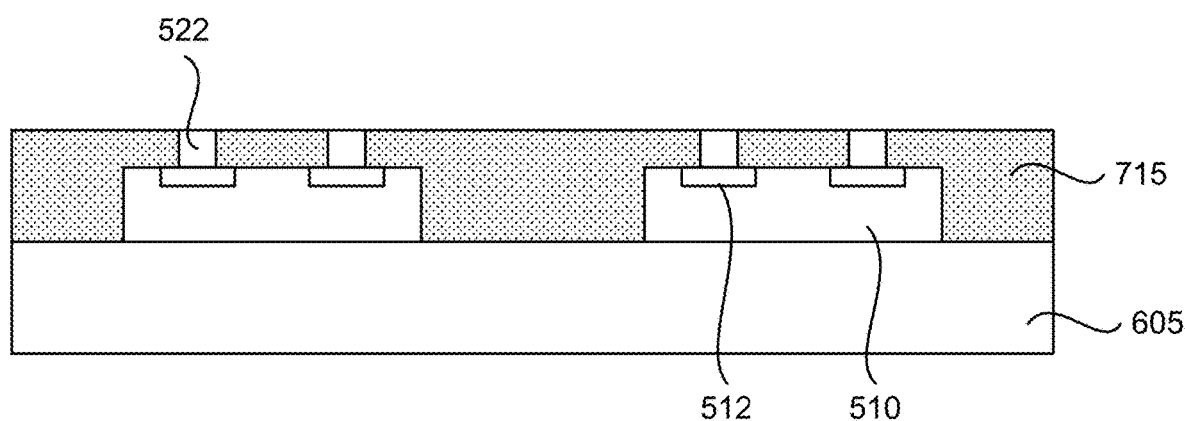

FIG. 7B illustrates a stage in which one or more conductive materials (e.g., metals such as Cu, Al, etc.) may be deposited in the photoresist via holes 717 to form lower conductor pillars 522. For example, a plating process may be utilized to form the lower conductor pillars 522.

Figure 7C:
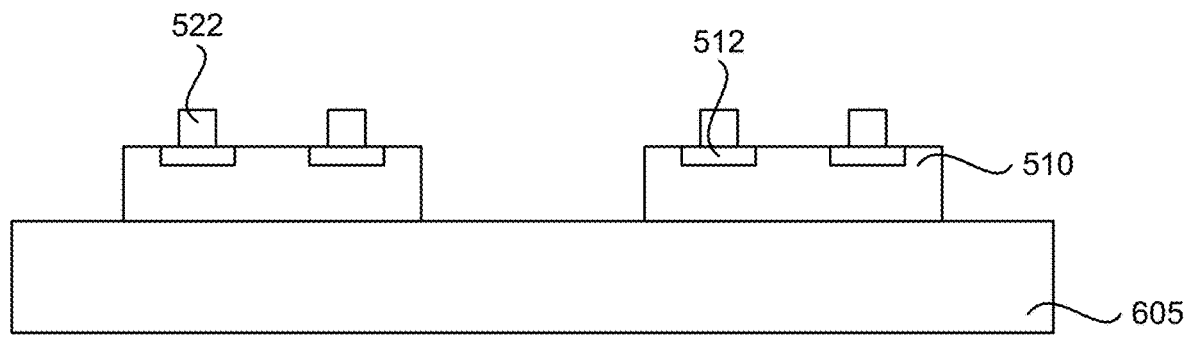

FIG. 7C illustrates a stage in which the photoresist 715 may be removed.

Figure 7D:
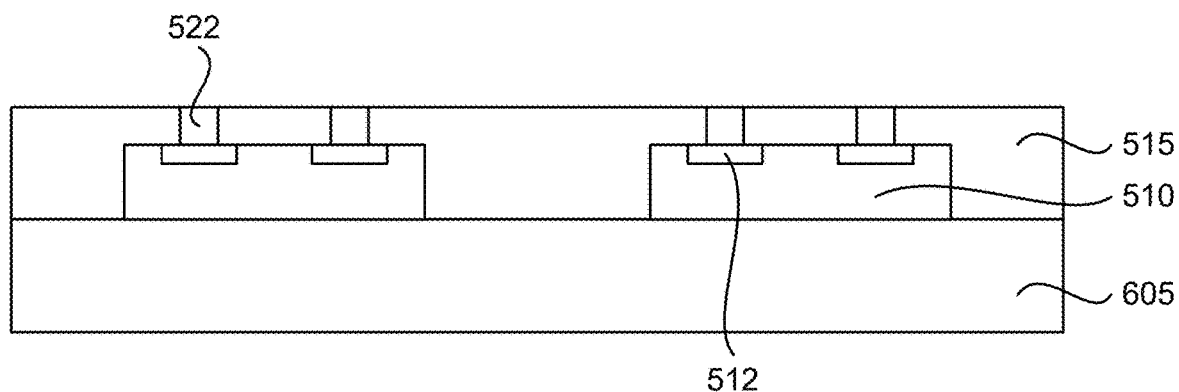

FIG. 7D illustrates a stage in which the lower mold 515 may be deposited on the reconstitution wafer 605 and on the BAW dies 510 such that the upper surface of the lower mold 515 is at the same level of the lower conductor pillars 522. For example, the lower mold 515 may be deposited to cover the lower conductor pillars 522, and thereafter maybe planarized to expose the upper surfaces of the lower conductor pillars 522. The acoustic domes 514 of the BAW dies 510 are still protected since the portions corresponding to the acoustic domes 514 are covered with the lower mold 515 and are not subject to the planarization.

Figure 7E:
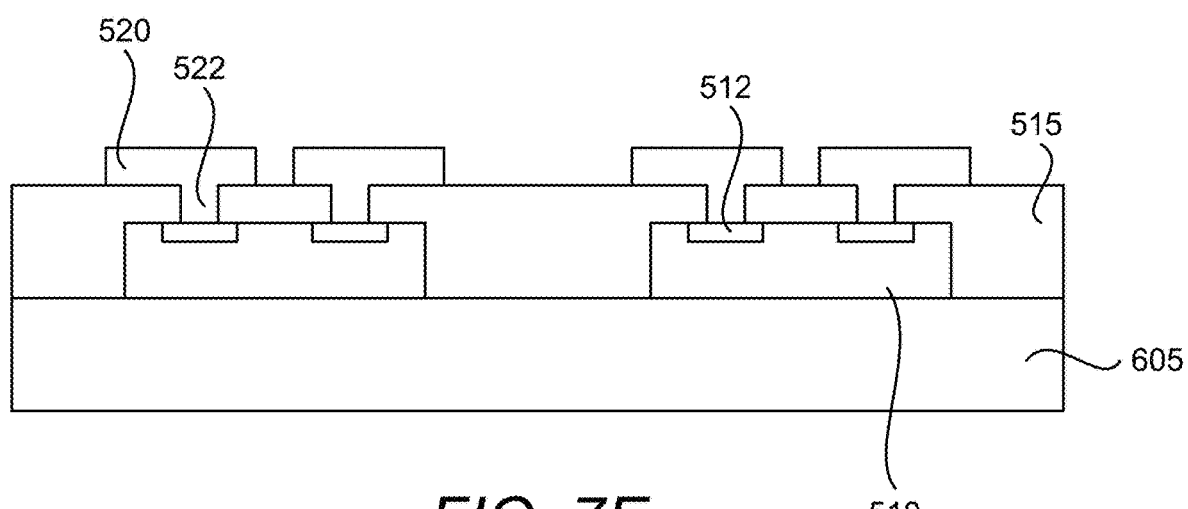

FIG. 7E illustrates a stage in which one or more conductive materials (e.g., metals such as Cu, Al, etc.) may be deposited to form the one or more lower conductors 520. Thereafter, the fabrication process to the stage illustrated in FIG. 6D. In this aspect, the one or more 3D inductors 580 may be formed in stages illustrated in FIGS. 7E-6F.

Figure 8A:
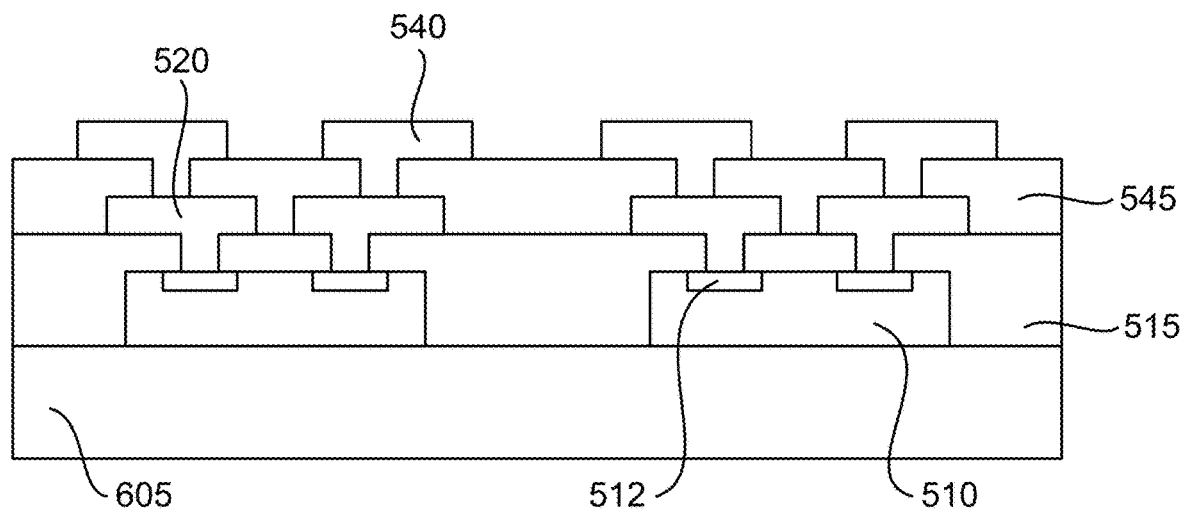
FIGS. 8A-8B illustrate examples of other alternative stages of fabricating a radio frequency filter in accordance with one or more aspects of the disclosure.
Figure 8B:
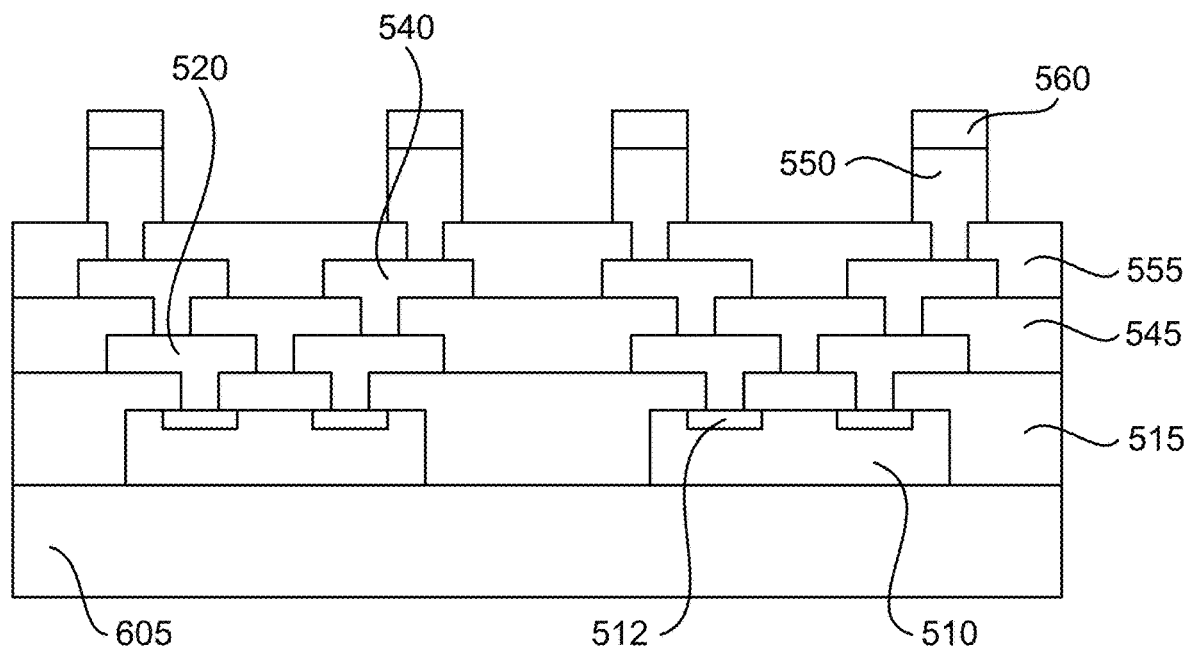

FIGS. 8A-8B illustrate stages of fabricating the alternative RF filter 500-2 illustrated in FIGS. 5C and 5D. From FIG. 6C, the fabrication process may proceed to FIG. 8A illustrating a stage in which a first passivation layer 545 may be deposited on the lower mold 515 and on the lower conductors 520. Alternatively, the fabrication process may proceed to the stage of FIG. 8A from the stage of FIG. 7E.

In the stage of FIG. 8A, the first passivation layer 545 may be patterned to form first upper passivation via holes to expose at least portions of the one or more lower conductors 520. Then one or more conductive materials (e.g., Cu, Al, etc.) may be deposited and patterned on the first passivation layer 545 and in the first upper passivation via holes to form one or more upper conductors 540. In this instance, it may be said that the upper RDL (comprising the upper conductors 540) may be formed on the lower RDL (comprising the lower conductors 520).

As indicated above with respect to FIG. 5D, the one or more 2D inductors 585 may be formed in stages illustrated in FIGS. 6C and 8A. Alternatively, one or more 2D inductors 585 may be formed in stages illustrated in FIGS. 7E and 8A.

FIG. 8B illustrates a stage in which one or more conductive materials (e.g., Cu, Al, etc.) may be deposited and patterned on the upper RDL (e.g., on the upper conductors 540) to form one or more external contacts 550. Also, one or more interconnects (e.g., solder) 560 may be formed on the external contacts 550.

Figure 9:
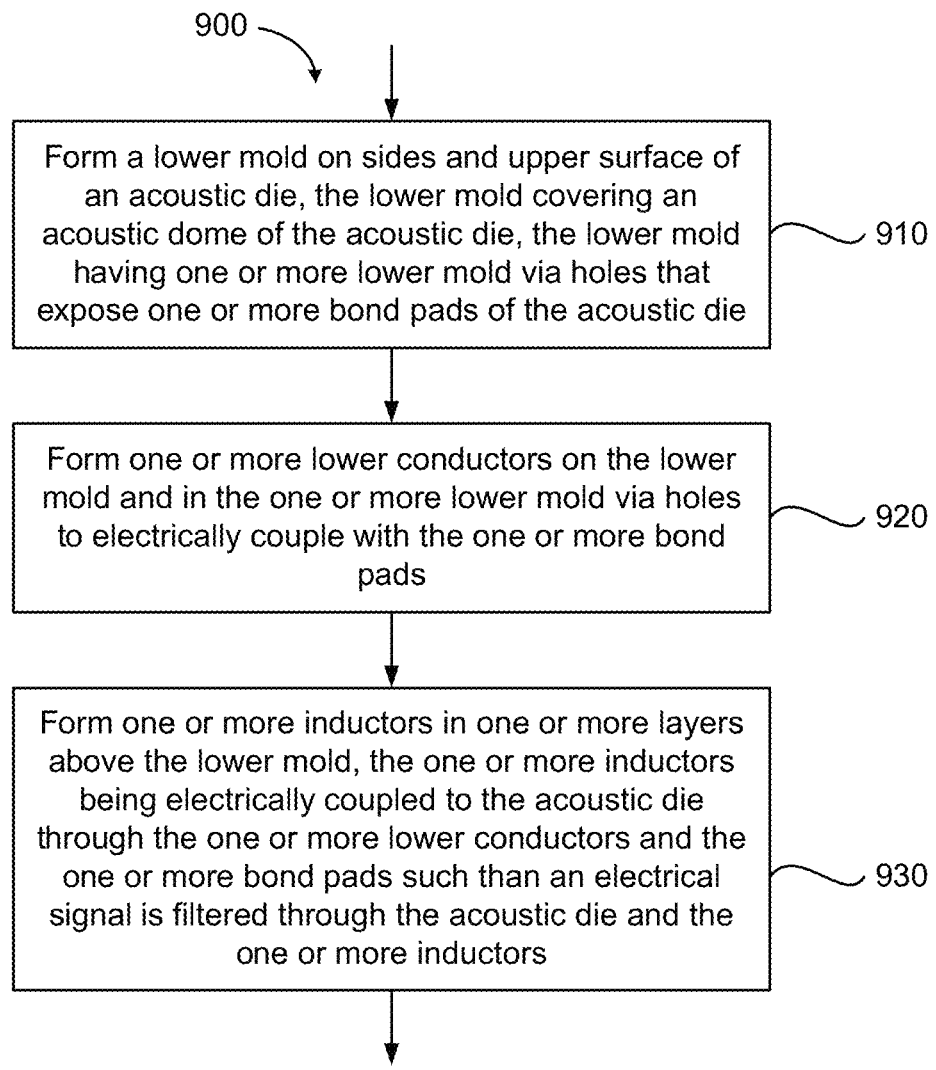
FIGS. 9-13 illustrate flow charts of an example method of manufacturing an RF filter in accordance with at one or more aspects of the disclosure.

FIG. 9 illustrates a flow chart of an example method 900 of fabricating an RF filter, such as the RF filters 500-1, 500-2. In block 910, the lower mold 515 may be formed on sides and upper surface of an acoustic die 510. The lower mold 515 may cover the acoustic dome 514 of the acoustic die 510 (e.g., the BAW die). The lower mold 515 may have one or more lower mold via holes 617 that expose the one or more bond pads 512 of the acoustic die 510.

In block 920, one or more lower conductors 520 may be formed on the lower mold 515 and in the one or more lower mold via holes 617 to electrically couple with the one or more bond pads (512).

Figure 10:
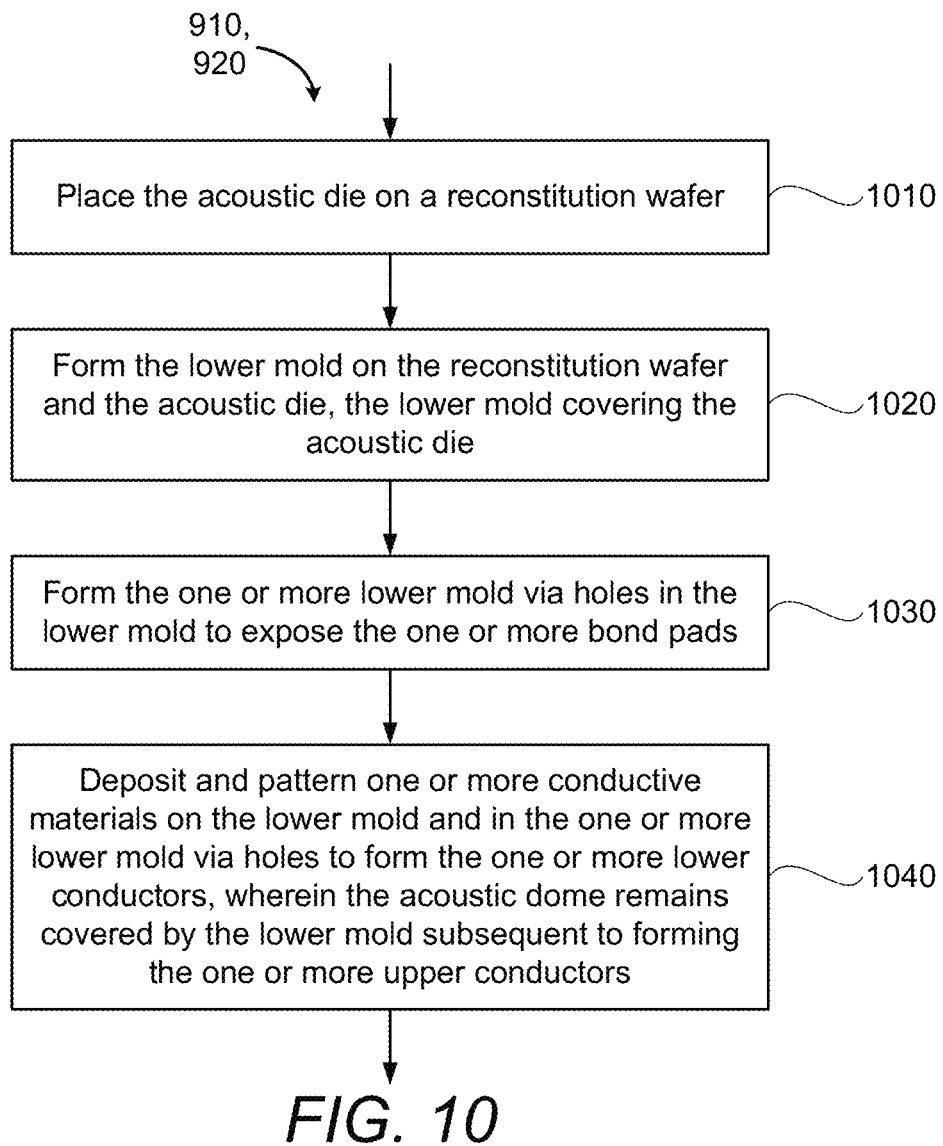

FIG. 10 illustrates a flow chart of an example process to implement blocks 910 and 920. In block 1010, the acoustic die 510 may be placed on a reconstitution wafer 605.

In block 1020, the lower mold 515 may be formed on the reconstitution wafer 605 and the acoustic die 510. The lower mold 515 may cover the acoustic die 510.

In block 1030, the one or more lower mold via holes 617 may be formed in the lower mold 515 to expose the one or more bond pads 512. In an aspect, the lower mold 515 may be laser drilled to form the one or more lower mold via holes 617.

In block 1040, one or more conductive materials (e.g., Cu, Al, etc.) may be deposited and patterned on the lower mold 515 and in the one or more lower mold via holes 617 to form the one or more lower conductors 520. The acoustic dome 514 may remain covered by the lower mold 515 subsequent to forming the one or more lower conductors 520.

Figure 11:
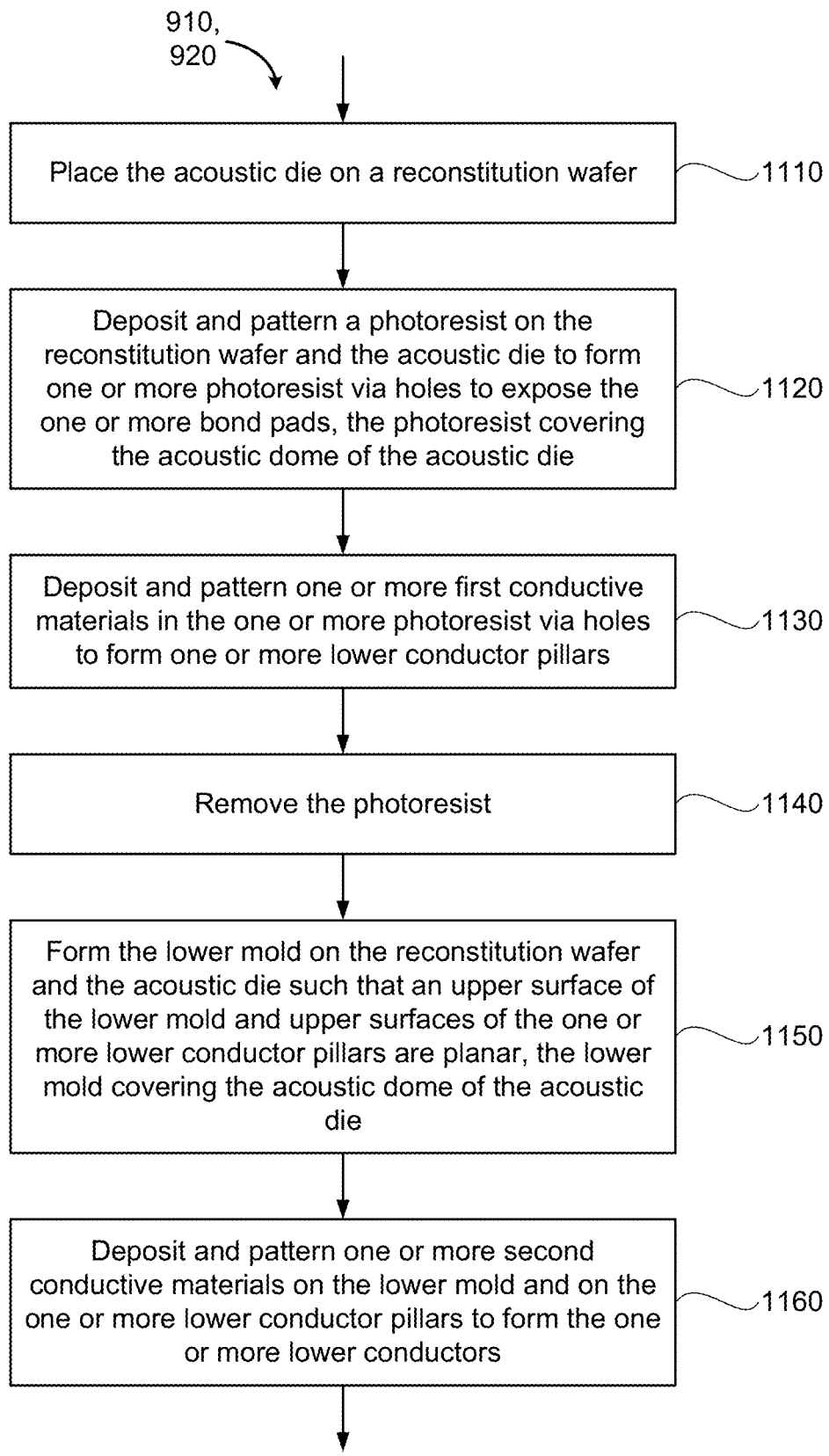

FIG. 11 illustrates a flow chart of another example process to implement blocks 910 and 920. In block 1110, the acoustic die 510 may be placed on a reconstitution wafer 605.

In block 1120, a photoresist 715 may be deposited and patterned on the reconstitution wafer 605 and the acoustic die 510 to form one or more photoresist via holes 717 to expose the one or more bond pads 512. The photoresist 715 may cover the acoustic dome 514 of the acoustic die 510.

In block 1130, one or more first conductive materials (e.g., Cu, Al, etc.) may be deposited and patterned in the one or more photoresist via holes 717 to form one or more lower conductor pillars 522.

In block 1140, the photoresist 715 may be removed.

In block 1150, the lower mold 515 may be formed on the reconstitution wafer 605 and the acoustic die 510 such that an upper surface of the lower mold 515 and upper surfaces of the one or more lower conductor pillars 522 are planar. The lower mold 515 may cover the acoustic dome 514 of the acoustic die 510.

In block 1160, one or more second conductive materials (e.g., Cu, Al, etc.) may be deposited and patterned on the lower mold 515 and on the one or more lower conductor pillars 522 to form the one or more lower conductors 520.

Referring back to FIG. 9, in block 930, one or more inductors 580, 585 may be formed in one or more layers above the lower mold 515. The one or more inductors 580, 585 may be electrically coupled to the acoustic die 510 through the one or more lower conductors 520 and the one or more bond pads 512 such that an electrical signal is filtered through the acoustic die 510 and the one or more inductors 580, 585.

Figure 12:
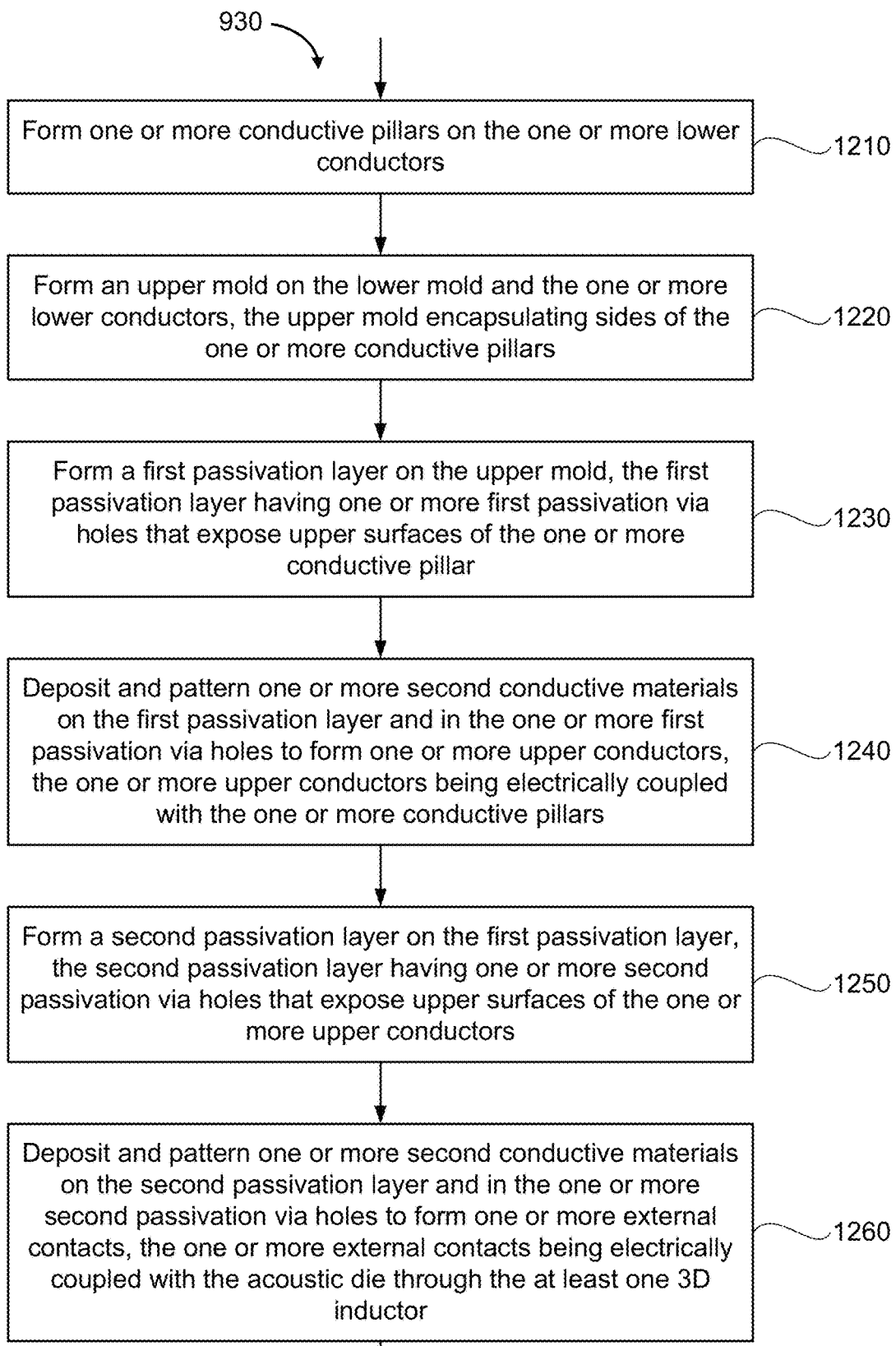

In an aspect, the one or more inductors may include at least one 3D (or solenoid) inductor 580. FIG. 12 illustrates a flow chart of an example process to implement block 930 to form a 3D inductor 580. In block 1210, one or more conductive pillars 530 may be formed on the one or more lower conductors 520.

In block 1220, an upper mold 535 may be formed on the lower mold 515 and the one or more lower conductors 520. The upper mold 535 may encapsulate sides of the one or more conductive pillars 530.

In block 1230, a first passivation layer 545 may be formed on the upper mold 535. The first passivation layer 545 may have one or more first passivation via holes that expose upper surfaces of the one or more conductive pillars.

In block 1240, one or more first conductive materials (e.g., copper, aluminum, etc.) may be deposited and patterned on the first passivation layer 545 and in the one or more first passivation via holes to form one or more upper conductors 540. The one or more upper conductors 540 may be electrically coupled with the one or more conductive pillars 530. The at least one 3D inductor 580 may comprise one or more loops formed by the one or more conductive pillars 530, the one or more lower conductors 520 (i.e., the lower RDL), and the one or more upper conductors 540 (i.e., the upper RDL).

In block 1250, a second passivation layer 555 may be formed on the first passivation layer 545. The second passivation layer 555 may have one or more second passivation via holes that expose upper surfaces of the one or more upper conductors 540.

In block 1260, one or more second conductive materials (e.g., copper, aluminum, etc.) may be deposited and patterned on the second passivation layer 555 and in the one or more second passivation via holes to form one or more external contacts 550. In this instance, the one or more external contacts 550 may be electrically coupled with the acoustic die 510 through the at least one 3D inductor 580.

Figure 13:
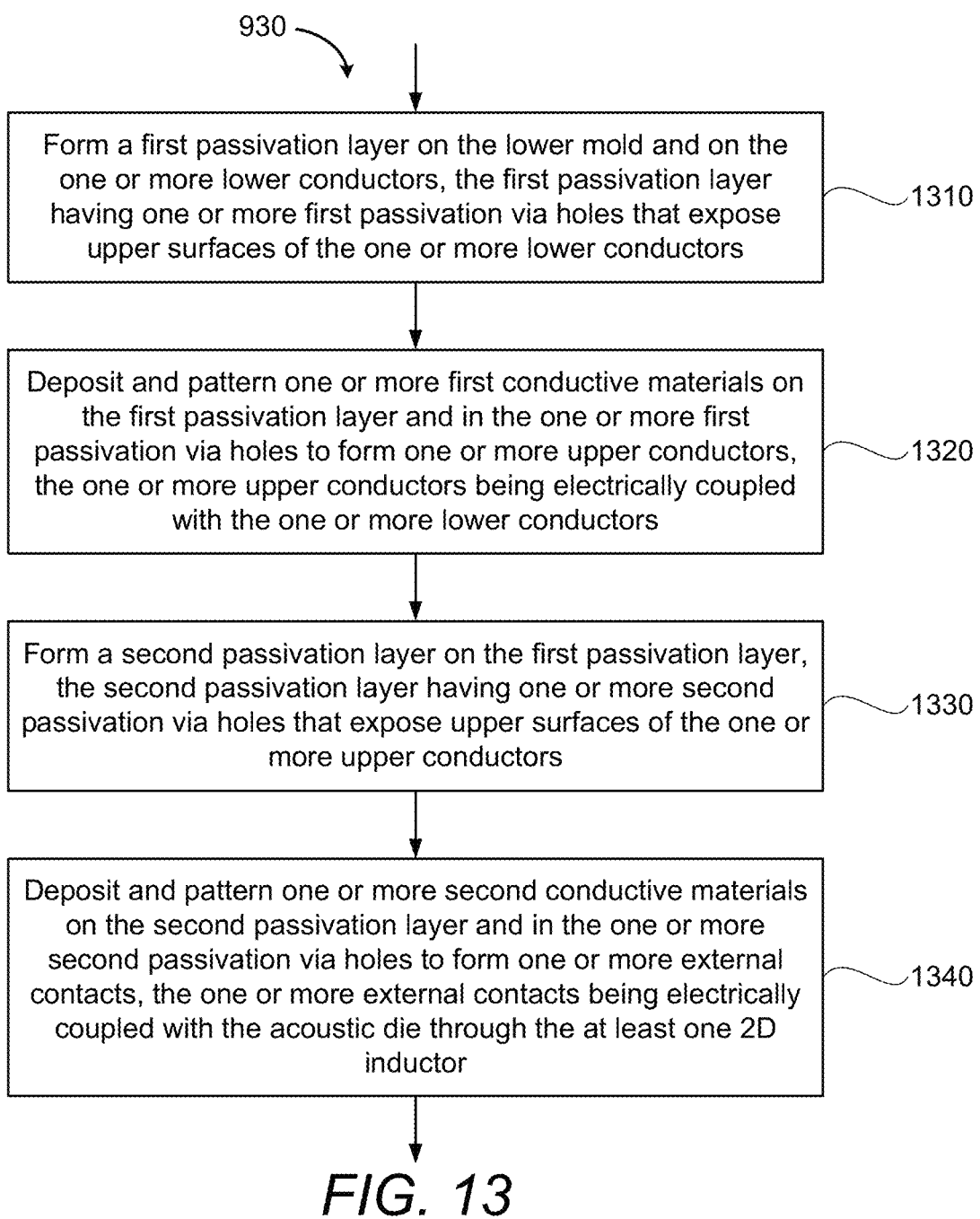

In another aspect, the one or more inductors may include at least one 2D (or laminate) inductor 585. FIG. 13 illustrates a flow chart of an example process to implement block 930 to form a 2D inductor 585. In block 1310, a first passivation layer 545 may be formed on the lower mold 515 and on the one or more lower conductors 520. The first passivation layer 545 may have one or more first passivation via holes that expose upper surfaces of the one or more lower conductors 520.

In block 1320, one or more first conductive materials (e.g., copper, aluminum, etc.) may be deposited and patterned on the first passivation layer 545 and in the one or more first passivation via holes to form one or more upper conductors 540. The one or more upper conductors 540 may be electrically coupled with the one or more lower conductors 520. The at least one 2D inductor 585 may comprise one or more loops formed by the one or more lower conductors 520 (e.g., by the lower RDL) or by the one or more upper conductors 540 (e.g., by the upper RDL).

In block 1330, a second passivation layer 555 may be formed on the first passivation layer 545. The second passivation layer 555 may have one or more second passivation via holes that expose upper surfaces of the one or more upper conductors 540.

In block 1340, one or more second conductive materials (e.g., copper, aluminum, etc.) may be deposited and patterned on the second passivation layer 555 and in the one or more second passivation via holes to form one or more external contacts 550. In this instance, the one or more external contacts 550 may be electrically coupled with the acoustic die 510 through the at least one 2D inductor 585.

It will be appreciated that the foregoing fabrication processes and related discussion were provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations. Further, it will be appreciated that the illustrated configurations and descriptions are provided merely to aid in the explanation of the various aspects disclosed herein. For example, the number and location of the inductors, the metallization structure may have more or less conductive and insulating layers, the cavity orientation, size, whether it is formed of multiple cavities, is closed or open, and other aspects may have variations driven by specific application design features, such as the number of antennas, antenna type, frequency range, power, etc. Accordingly, the forgoing illustrative examples and associated figures should not be construed to limit the various aspects disclosed and claimed herein.

Figure 14:
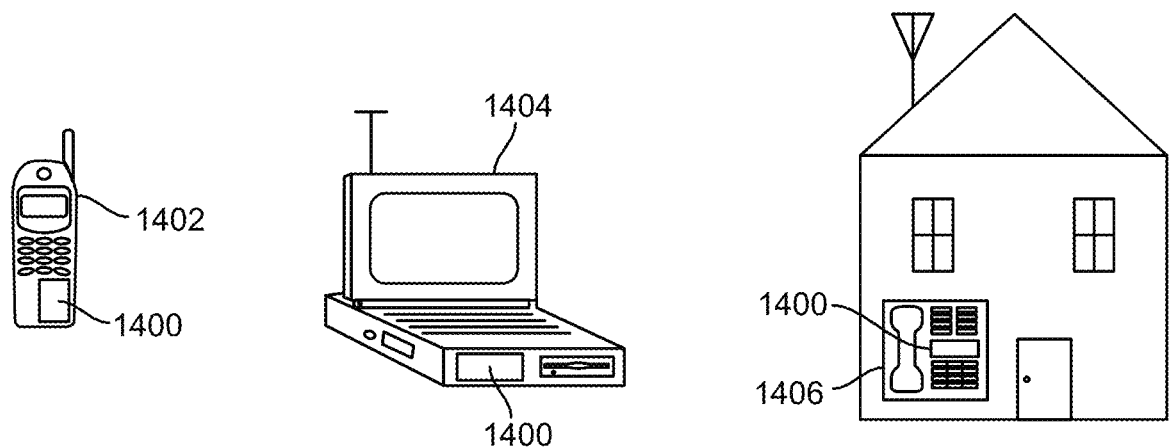
FIG. 14 illustrates various electronic devices which may utilize one or more aspects of the disclosure.

FIG. 14 illustrates various electronic devices that may be integrated with any of the aforementioned devices in accordance with various aspects of the disclosure. For example, a mobile phone device 1402, a laptop computer device 1404, and a fixed location terminal device 1406 may each be considered generally user equipment (UE) and may include the RF filter 1400 (e.g., RF filter 500-1, 500-2) as described herein. The devices 1402, 1404, 1406 illustrated in FIG. 14 are merely exemplary. Other electronic devices may also include the RF filter including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A radio frequency (RF) filter, comprising: an acoustic die; a lower mold formed on sides and upper surface of the acoustic die, the lower mold covering an acoustic dome of the acoustic die, the lower mold having one or more lower mold via holes that expose one or more bond pads of the acoustic die; one or more lower conductors formed on the lower mold and in the one or more lower mold via holes to electrically couple with the one or more bond pads; and one or more inductors formed in one or more layers above the lower mold, the one or more inductors being electrically coupled to the acoustic die through the one or more lower conductors and the one or more bond pads such that an electrical signal is filtered through the acoustic die and the one or more inductors.

Clause 2: The RF filter of clause 1, wherein the one or more inductors comprises at least one 3D inductor.

Clause 3: The RF filter of clause 2, further comprising: one or more conductive pillars formed on the one or more lower conductors; one or more upper conductors formed on the one or more conductive pillars, wherein the at least one 3D inductor comprises one or more loops formed by the one or more conductive pillars, the one or more lower conductors, and the one or more upper conductors.

Clause 4: The RF filter of clause 3, further comprising: an upper mold formed on the lower mold and the one or more lower conductors, the upper mold encapsulating sides of the one or more conductive pillars; and a first passivation layer formed on the upper mold, the first passivation layer having one or more first passivation via holes that expose upper surfaces of the one or more conductive pillars, the one or more upper conductors being formed on the first passivation layer and in the one or more first passivation via holes to electrically couple with the one or more conductive pillars.

Clause 5: The RF filter of any of clause 4, further comprising: a second passivation layer formed on the first passivation layer, the second passivation layer having one or more second passivation via holes that expose upper surfaces of the one or more upper conductors; and one or more external contacts formed on the second passivation layer and in the one or more second passivation via holes to electrically couple with the acoustic die through the at least one 3D inductor.

Clause 6: The RF filter of clause 5, wherein the first passivation layer is a first polyimide layer, the second passivation layer is a second polyimide layer, the one or more external contacts are formed from copper, or any combination thereof.

Clause 7: The RF filter of clause 1, wherein the one or more inductors comprises at least one 2D inductor.

Clause 8: The RF filter of clause 7, further comprising: one or more upper conductors formed on the one or more lower conductors, wherein the at least one 2D inductor comprises one or more loops formed by the one or more lower conductors or by the one or more upper conductors.

Clause 9: The RF filter of clause 8, further comprising: a first passivation layer formed on the lower mold, the first passivation layer having one or more first passivation via holes that expose upper surfaces of the one or more lower conductors, the one or more upper conductors being formed on the first passivation layer and in the one or more first passivation via holes to electrically couple with the one or more lower conductors.

Clause 10: The RF filter of clause 9, further comprising: a second passivation layer formed on the first passivation layer, the second passivation layer having one or more second passivation via holes that expose upper surfaces of the one or more upper conductors; and one or more external contacts formed on the second passivation layer and in the one or more second passivation via holes to electrically couple with the acoustic die through the at least one 2D inductor.

Clause 11: The RF filter of clause 10, wherein the first passivation layer is a first polyimide layer, the second passivation layer is a second polyimide layer, the one or more external contacts are formed from copper, or any combination thereof.

Clause 12: The RF filter of any of clauses 1-11, wherein the acoustic die is a bulk acoustic wave (BAW) die.

Clause 13: The RF filter of any of clauses 1-12, wherein the one or more lower conductors are formed from copper, the one or more inductors are formed from copper, or both.

Clause 14: The RF filter of any of clauses 1-13, wherein the RF filter is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 15: A method of fabricating a radio frequency (RF) filter, comprising: forming a lower mold on sides and upper surface of an acoustic die, the lower mold covering an acoustic dome of the acoustic die, the lower mold having one or more lower mold via holes that expose one or more bond pads of the acoustic die; forming one or more lower conductors on the lower mold and in the one or more lower mold via holes to electrically couple with the one or more bond pads; and forming one or more inductors in one or more layers above the lower mold, the one or more inductors being electrically coupled to the acoustic die through the one or more lower conductors and the one or more bond pads such that an electrical signal is filtered through the acoustic die and the one or more inductors.

Clause 16: The method of clause 15, wherein forming the lower mold and forming the one or more lower conductors comprises: placing the acoustic die on a reconstitution wafer; forming the lower mold on the reconstitution wafer and the acoustic die, the lower mold covering the acoustic die; forming the one or more lower mold via holes in the lower mold to expose the one or more bond pads; and depositing and patterning one or more conductive materials on the lower mold and in the one or more lower mold via holes to form the one or more lower conductors, wherein the acoustic dome remains covered by the lower mold subsequent to forming the one or more upper conductors.

Clause 17: The method of clause 16, comprising: wherein the one or more lower mold via holes are formed by laser drilling the lower mold.

Clause 18: The method of any of clause 16-17, wherein the one or more conductive materials include copper.

Clause 19: The method of any of clauses 15-18, wherein forming the lower mold and forming the one or more lower conductors comprises: placing the acoustic die on a reconstitution wafer; depositing and patterning a photoresist on the reconstitution wafer and the acoustic die to form one or more photoresist via holes to expose the one or more bond pads, the photoresist covering the acoustic dome of the acoustic die; depositing and patterning one or more first conductive materials in the one or more photoresist via holes to form one or more lower conductor pillars; removing the photoresist; forming the lower mold on the reconstitution wafer and the acoustic die such that an upper surface of the lower mold and upper surfaces of the one or more lower conductor pillars are planar, the lower mold covering the acoustic dome of the acoustic die; and depositing and patterning one or more second conductive materials on the lower mold and on the one or more lower conductor pillars to form the one or more lower conductors.

Clause 20: The method of clause 19, wherein the one or more lower conductor including the lower conductor pillars are formed from copper.

Clause 21: The method of any of clauses 15-20, wherein the one or more inductors comprises at least one 3D inductor.

Clause 22: The method of clause 21, wherein forming the one or more inductors comprises: forming one or more conductive pillars on the one or more lower conductors; forming an upper mold on the lower mold and the one or more lower conductors, the upper mold encapsulating sides of the one or more conductive pillars; forming a first passivation layer on the upper mold, the first passivation layer having one or more first passivation via holes that expose upper surfaces of the one or more conductive pillars; and depositing and patterning one or more first conductive materials on the first passivation layer and in the one or more first passivation via holes to form one or more upper conductors, the one or more upper conductors being electrically coupled with the one or more conductive pillars, wherein the at least one 3D inductor comprises one or more loops formed by the one or more conductive pillars, the one or more lower conductors, and the one or more upper conductors.

Clause 23: The method of clause 22, wherein forming the one or more inductors further comprises: forming a second passivation layer on the first passivation layer, the second passivation layer having one or more second passivation via holes that expose upper surfaces of the one or more upper conductors; and depositing and patterning one or more second conductive materials on the second passivation layer and in the one or more second passivation via holes to form one or more external contacts, the one or more external contacts being electrically coupled with the acoustic die through the at least one 3D inductor.

Clause 24: The method of clause 23, wherein the one or more conductive pillars are formed from copper, the one or more upper conductors are formed from copper, the one or more external contacts are formed from copper, or any combination thereof.

Clause 25: The method of any of clauses 15-20, wherein the one or more inductors comprises at least one 2D inductor.

Clause 26: The method of clause 25, wherein forming the one or more inductors comprises: forming a first passivation layer on the lower mold and on the one or more lower conductors, the first passivation layer having one or more first passivation via holes that expose upper surfaces of the one or more lower conductors; and depositing and patterning one or more first conductive materials on the first passivation layer and in the one or more first passivation via holes to form one or more upper conductors, the one or more upper conductors being electrically coupled with the one or more lower conductors, wherein the at least one 2D inductor comprises one or more loops formed by the one or more lower conductors or by the one or more upper conductors.

Clause 27: The method of clause 26, wherein forming the one or more inductors further comprises: forming a second passivation layer on the first passivation layer, the second passivation layer having one or more second passivation via holes that expose upper surfaces of the one or more upper conductors; and depositing and patterning one or more second conductive materials on the second passivation layer and in the one or more second passivation via holes to form one or more external contacts, the one or more external contacts being electrically coupled with the acoustic die through the at least one 2D inductor.

Clause 28: The method of clause 27, wherein the one or more upper conductors are formed from copper, the one or more external contacts are formed from copper, or both.

Clause 29: The method of any of clauses 15-28, wherein the acoustic die is a bulk acoustic wave (BAW) die.

Clause 30: The method of any of clauses 15-29, wherein the one or more lower conductors are formed from copper, the one or more inductors are formed from copper, or both.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A radio frequency (RF) filter, comprising:
   an acoustic die;
   a lower mold formed on sides and upper surface of the acoustic die, the lower mold covering an acoustic dome of the acoustic die, the lower mold having one or more lower mold via holes that expose one or more bond pads of the acoustic die;
   one or more lower conductors formed on the lower mold and in the one or more lower mold via holes to electrically couple with the one or more bond pads; and
   one or more inductors formed in one or more layers above the lower mold, the one or more inductors being electrically coupled to the acoustic die through the one or more lower conductors and the one or more bond pads such that an electrical signal is filtered through the acoustic die and the one or more inductors.

2. The RF filter of claim 1, wherein the one or more inductors comprises at least one 3D inductor.

3. The RF filter of claim 2, further comprising:
   one or more conductive pillars formed on the one or more lower conductors; and
   one or more upper conductors formed on the one or more conductive pillars,
   wherein the at least one 3D inductor comprises one or more loops formed by the one or more conductive pillars, the one or more lower conductors, and the one or more upper conductors.

4. The RF filter of claim 3, further comprising:
   an upper mold formed on the lower mold and the one or more lower conductors, the upper mold encapsulating sides of the one or more conductive pillars; and
   a first passivation layer formed on the upper mold, the first passivation layer having one or more first passivation via holes that expose upper surfaces of the one or more conductive pillars, the one or more upper conductors being formed on the first passivation layer and in the one or more first passivation via holes to electrically couple with the one or more conductive pillars.

5. The RF filter of claim 4, further comprising:
a second passivation layer formed on the first passivation layer, the second passivation layer having one or more second passivation via holes that expose upper surfaces of the one or more upper conductors; and
one or more external contacts formed on the second passivation layer and in the one or more second passivation via holes to electrically couple with the acoustic die through the at least one 3D inductor.

6. The RF filter of claim 5, wherein
the first passivation layer is a first polyimide layer,
the second passivation layer is a second polyimide layer,
the one or more external contacts are formed from copper, or
any combination thereof.

7. The RF filter of claim 1, wherein the one or more inductors comprises at least one 2D inductor.

8. The RF filter of claim 7, further comprising:
one or more upper conductors formed on the one or more lower conductors,
wherein the at least one 2D inductor comprises one or more loops formed by the one or more lower conductors or by the one or more upper conductors.

9. The RF filter of claim 8, further comprising:
a first passivation layer formed on the lower mold, the first passivation layer having one or more first passivation via holes that expose upper surfaces of the one or more lower conductors, the one or more upper conductors being formed on the first passivation layer and in the one or more first passivation via holes to electrically couple with the one or more lower conductors.

10. The RF filter of claim 9, further comprising:
a second passivation layer formed on the first passivation layer, the second passivation layer having one or more second passivation via holes that expose upper surfaces of the one or more upper conductors; and
one or more external contacts formed on the second passivation layer and in the one or more second passivation via holes to electrically couple with the acoustic die through the at least one 2D inductor.

11. The RF filter of claim 10, wherein
the first passivation layer is a first polyimide layer,
the second passivation layer is a second polyimide layer,
the one or more external contacts are formed from copper, or
any combination thereof.

12. The RF filter of claim 1, wherein the acoustic die is a bulk acoustic wave (BAW) die.

13. The RF filter of claim 1, wherein
the one or more lower conductors are formed from copper,
the one or more inductors are formed from copper, or
both.

14. The RF filter of claim 1, wherein the RF filter is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

15. A method of fabricating a radio frequency (RF) filter, the method comprising:
forming a lower mold on sides and upper surface of an acoustic die, the lower mold covering an acoustic dome of the acoustic die, the lower mold having one or more lower mold via holes that expose one or more bond pads of the acoustic die;
forming one or more lower conductors on the lower mold and in the one or more lower mold via holes to electrically couple with the one or more bond pads; and
forming one or more inductors in one or more layers above the lower mold, the one or more inductors being electrically coupled to the acoustic die through the one or more lower conductors and the one or more bond pads such that an electrical signal is filtered through the acoustic die and the one or more inductors.

16. The method of claim 15, wherein forming the lower mold and forming the one or more lower conductors comprises:
placing the acoustic die on a reconstitution wafer;
forming the lower mold on the reconstitution wafer and the acoustic die, the lower mold covering the acoustic die;
forming the one or more lower mold via holes in the lower mold to expose the one or more bond pads; and
depositing and patterning one or more conductive materials on the lower mold and in the one or more lower mold via holes to form the one or more lower conductors,
wherein the acoustic dome remains covered by the lower mold subsequent to forming the one or more upper conductors.

17. The method of claim 16, wherein the one or more lower mold via holes are formed by laser drilling the lower mold.

18. The method of claim 16, wherein the one or more conductive materials include copper.

19. The method of claim 15, wherein forming the lower mold and forming the one or more lower conductors comprises:
placing the acoustic die on a reconstitution wafer;
depositing and patterning a photoresist on the reconstitution wafer and the acoustic die to form one or more photoresist via holes to expose the one or more bond pads, the photoresist covering the acoustic dome of the acoustic die;
depositing and patterning one or more first conductive materials in the one or more photoresist via holes to form one or more lower conductor pillars;
removing the photoresist;
forming the lower mold on the reconstitution wafer and the acoustic die such that an upper surface of the lower mold and upper surfaces of the one or more lower conductor pillars are planar, the lower mold covering the acoustic dome of the acoustic die; and
depositing and patterning one or more second conductive materials on the lower mold and on the one or more lower conductor pillars to form the one or more lower conductors.

20. The method of claim 19, wherein the one or more lower conductor including the lower conductor pillars are formed from copper.

21. The method of claim 15, wherein the one or more inductors comprises at least one 3D inductor.

22. The method of claim 21, wherein forming the one or more inductors comprises:
forming one or more conductive pillars on the one or more lower conductors;
forming an upper mold on the lower mold and the one or more lower conductors, the upper mold encapsulating sides of the one or more conductive pillars;

forming a first passivation layer on the upper mold, the first passivation layer having one or more first passivation via holes that expose upper surfaces of the one or more conductive pillars; and depositing and patterning one or more first conductive materials on the first passivation layer and in the one or more first passivation via holes to form one or more upper conductors, the one or more upper conductors being electrically coupled with the one or more conductive pillars, wherein the at least one 3D inductor comprises one or more loops formed by the one or more conductive pillars, the one or more lower conductors, and the one or more upper conductors.

23. The method of claim 22, wherein forming the one or more inductors further comprises:

forming a second passivation layer on the first passivation layer, the second passivation layer having one or more second passivation via holes that expose upper surfaces of the one or more upper conductors; and depositing and patterning one or more second conductive materials on the second passivation layer and in the one or more second passivation via holes to form one or more external contacts, the one or more external contacts being electrically coupled with the acoustic die through the at least one 3D inductor.

24. The method of claim 23, wherein the one or more conductive pillars are formed from copper, the one or more upper conductors are formed from copper, the one or more external contacts are formed from copper, or any combination thereof.

25. The method of claim 15, wherein the one or more inductors comprises at least one 2D inductor.

26. The method of claim 25, wherein forming the one or more inductors comprises:

forming a first passivation layer on the lower mold and on the one or more lower conductors, the first passivation layer having one or more first passivation via holes that expose upper surfaces of the one or more lower conductors; and depositing and patterning one or more first conductive materials on the first passivation layer and in the one or more first passivation via holes to form one or more upper conductors, the one or more upper conductors being electrically coupled with the one or more lower conductors, wherein the at least one 2D inductor comprises one or more loops formed by the one or more lower conductors or by the one or more upper conductors.

27. The method of claim 26, wherein forming the one or more inductors further comprises:

forming a second passivation layer on the first passivation layer, the second passivation layer having one or more second passivation via holes that expose upper surfaces of the one or more upper conductors; and depositing and patterning one or more second conductive materials on the second passivation layer and in the one or more second passivation via holes to form one or more external contacts, the one or more external contacts being electrically coupled with the acoustic die through the at least one 2D inductor.

28. The method of claim 27, wherein the one or more upper conductors are formed from copper, the one or more external contacts are formed from copper, or both.

29. The method of claim 15, wherein the acoustic die is a bulk acoustic wave (BAW) die.

30. The method of claim 15, wherein the one or more lower conductors are formed from copper, the one or more inductors are formed from copper, or both.

* * * * *